(12) United States Patent
Kubota et al.

(10) Patent No.: US 7,193,604 B2
(45) Date of Patent: Mar. 20, 2007

(54) SHIFT REGISTER CIRCUIT, IMAGE DISPLAY APPARATUS HAVING THE CIRCUIT, AND DRIVING METHOD FOR LCD DEVICES

(75) Inventors: Yasushi Kubota, Sakurai (JP); Hajime Washio, Tenri (JP); Shigeto Yoshida, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/060,963

(22) Filed: Feb. 18, 2005

(65) Prior Publication Data

US 2005/0140621 A1 Jun. 30, 2005

Related U.S. Application Data

(63) Continuation of application No. 09/523,511, filed on Mar. 10, 2000, now Pat. No. 6,879,313.

(30) Foreign Application Priority Data

Mar. 11, 1999 (JP) ................... 11-065691
Jun. 22, 1999 (JP) ................... 11-175311

(51) Int. Cl.
*G09G 3/36* (2006.01)
(52) U.S. Cl. .................. 345/100; 345/599; 377/64; 377/78
(58) Field of Classification Search .......... 345/98–100, 345/599; 377/64, 78, 80
See application file for complete search history.

(56) References Cited

U.S. PATENT DOCUMENTS

| 5,903,014 | A |  | 5/1999 | Ino et al. |
| 5,949,271 | A | * | 9/1999 | Fujikura ..................... 327/390 |
| 6,018,331 | A | * | 1/2000 | Ogawa ........................ 345/99 |
| 6,266,041 | B1 | * | 7/2001 | Cairns et al. ............... 345/100 |

FOREIGN PATENT DOCUMENTS

| JP | 3-147598 | 6/1991 |
| JP | 7-147659 | 6/1995 |
| JP | 29-40078 | 6/1999 |

* cited by examiner

*Primary Examiner*—Richard Hjerpe
*Assistant Examiner*—Duc Dinh
(74) *Attorney, Agent, or Firm*—David G. Conlin; David A. Tucker; Edwards Angell Palmer & Dodge LLP

(57) ABSTRACT

A shift register circuit includes a plurality of latch circuits connected in series to sequentially transfer a pulse signal ST from one to another, a clock signal line transmitting a clock signal CLK, and a plurality of switching circuits performing electrical connection and disconnection between the clock signal line and the plurality of latch circuits. Upon turning on the shift register, at least one of the switching circuits electrically disconnects at least one of the latch circuits from the clock signal line. During an initialization period immediately after power has been turned on, the frequency of the clock signal CLK is lower than in a normal operation period and gradually increases toward the frequency used in the normal operation period.

11 Claims, 29 Drawing Sheets

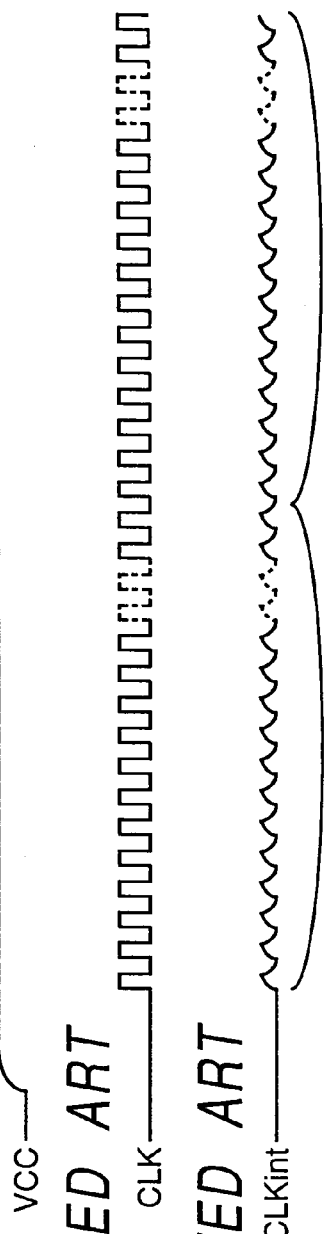
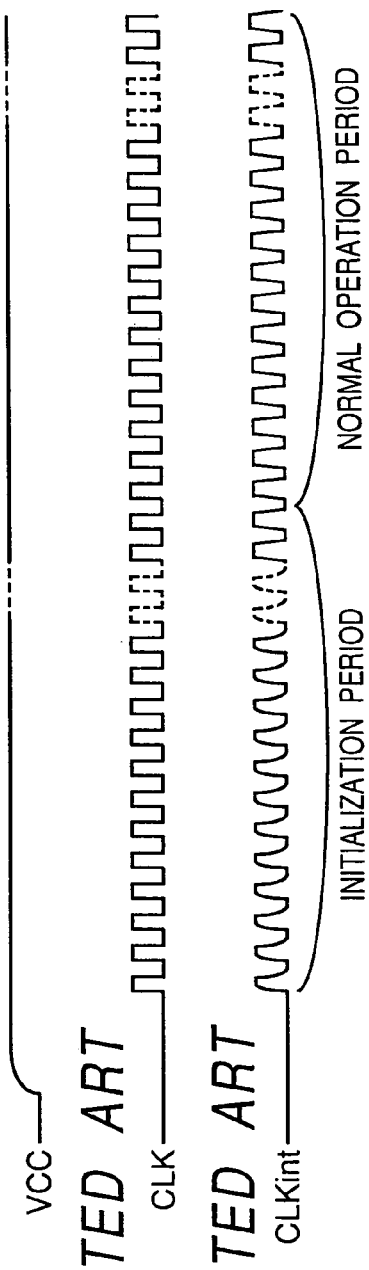
Fig. 2A RELATED ART — VCC
Fig. 2B RELATED ART — CLK
Fig. 2C RELATED ART — CLKint
Fig. 3A RELATED ART — VCC
Fig. 3B RELATED ART — CLK
Fig. 3C RELATED ART — CLKint

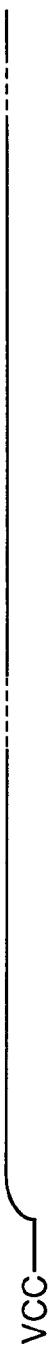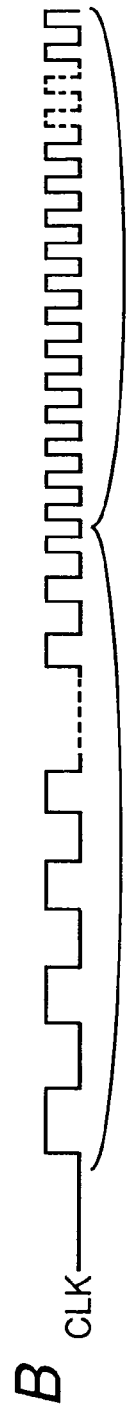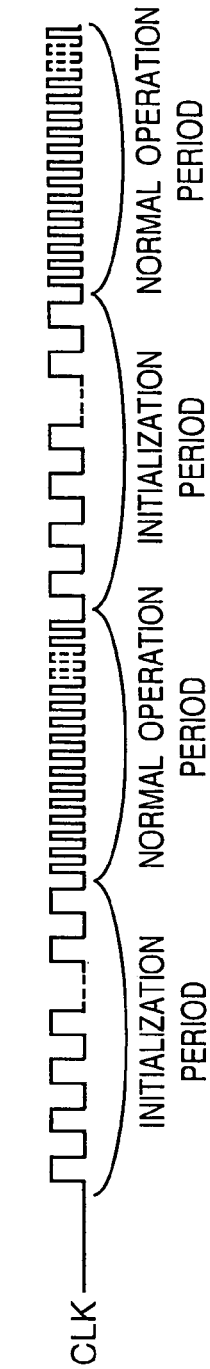
Fig.6A $V_{CC}$
Fig.6B CLK
Fig.7A $V_{CC}$
Fig.7B PLS
Fig.7C CLK

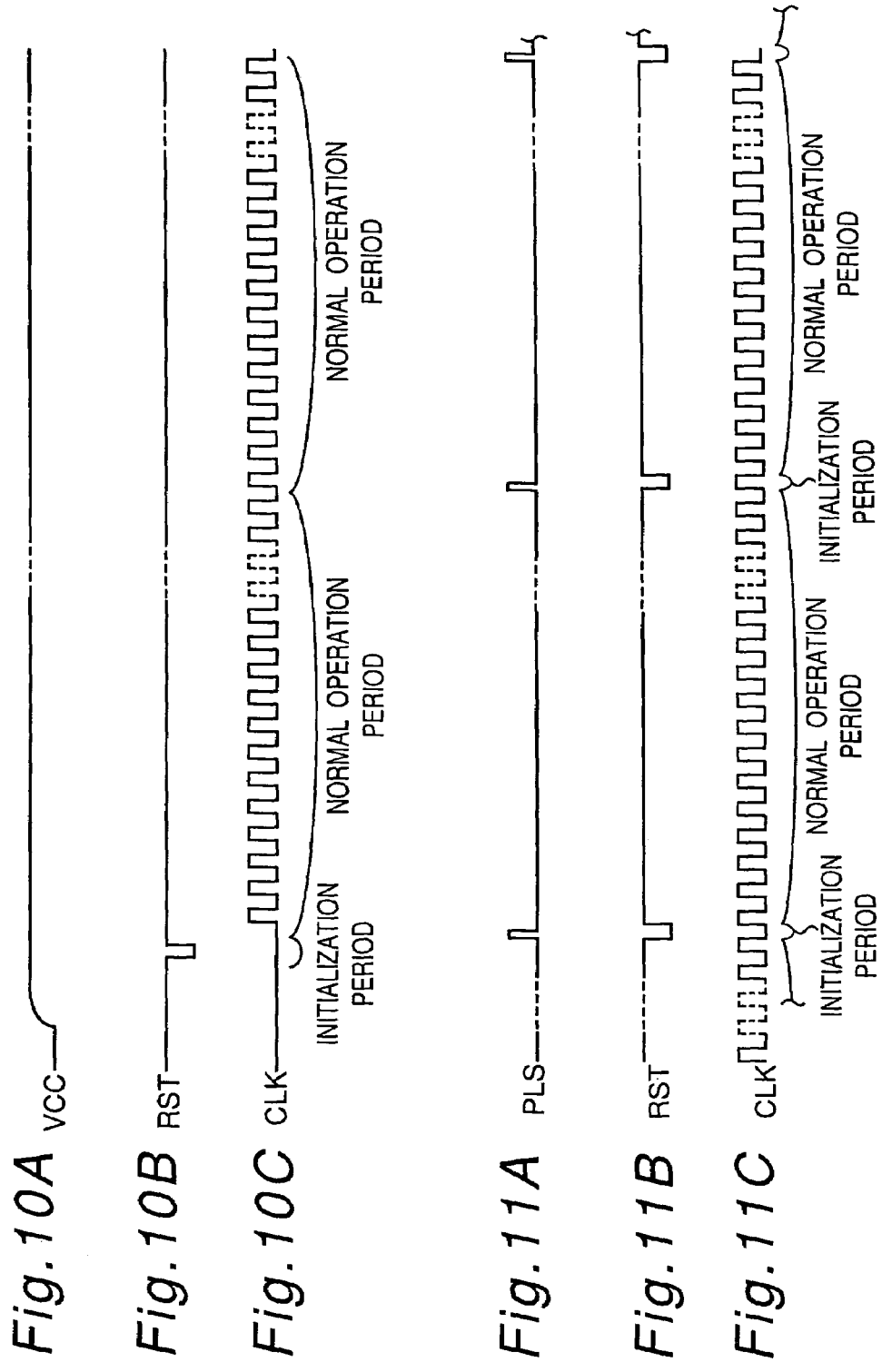

Vsync

VIDEO SG.

GCLK

SHIFT REGISTER CIRCUIT, IMAGE DISPLAY APPARATUS HAVING THE CIRCUIT, AND DRIVING METHOD FOR LCD DEVICES

This application is a Continuation of U.S. patent application Ser. No. 09/523,511, entitled SHIFT REGISTER CIRCUIT, IMAGE DISPLAY APPARATUS HAVING THE CIRCUIT, AND DRIVING METHOD FOR LCD DEVICES, filed Mar. 10, 2000 now U.S. Pat. No. 6,879,313; by Yasushi KUBOTA, Hajime WASHIO, Shigeto YOSHIDA (the inventors of the claims of this continuation application), Kazuhiro Maeda and Hiroshi Yoneda.

TECHNICAL FIELD

The present invention relates to a shift register circuit for transferring a digital signal in synchronization with a leading edge and a trailing edge of a clock signal. More particularly, the invention relates to a shift register circuit arranged such that a clock signal is locally input to thereby reduce the load on a clock signal line, with a view to increasing the operating margin and reducing power consumption, and also relates to an image display apparatus in which such a shift register circuit is applied to a data driver and/or a scan driver.

The invention further relates to a driving method for active matrix type liquid crystal display devices to be used for TV monitors, portable information terminals and the like. More particularly, the invention relates to a driving method to be used for displaying a picture having such an aspect ratio as 16:9 on a liquid crystal display screen having such an aspect ratio as 4:3.

BACKGROUND OF THE INVENTION

As a conventional liquid crystal display (LCD) device, there has been known an LCD device of the active matrix driven system (hereinafter, referred to as "active matrix driven LCD device"). FIG. 19 shows an active matrix-driven LCD device 100.

The active matrix-driven LCD device 100 has a pixel array ARY, a scan driver GD and a data driver SD.

The pixel array ARY has a plurality of scan signal lines GL, and a plurality of data signal lines SL intersecting the plurality of scan signal lines GL. One pixel is provided in a position surrounded by adjacent two scan signal lines GL and adjacent two data signal lines SL, so that pixels PIX are arranged totally in a matrix form. In synchronization with a timing signal such as a clock signal SCK, the data driver SD samples an input video signal DAT, and amplifies, as required, and supplies the sampled video signal DAT to the data signal lines SL.

The scan driver GD, in synchronization with a timing signal such as a clock signal GCK, selects the scan signal lines GL sequentially to control the turn-on and -off of switching devices within the pixels PIX, whereby the video signal (data) supplied to the data signal lines SL is written to the pixels PIX. The pixels PIX function to retain the data written in the pixels PIX.

FIG. 20 shows details of the pixel PIX. The pixel PIX has a field effect transistor SW as a switching device, and a pixel capacitor CI (made up of liquid crystal capacitor CL and auxiliary capacitor CS, the latter being added as necessary.).

The field effect transistor SW has a drain, a source and a gate. Hereinafter, one of the drain and the source will be referred to as a first electrode and the other of the drain and the source as a second electrode.

The first electrode of the field effect transistor SW is connected to the data signal line SL, and the second electrode is connected to an end "a" of the pixel capacitor CI. Also, the gate of the field effect transistor SW is connected to the scan signal line GL. An end "b" of the liquid crystal capacitor CL is connected to a common electrode line which is common to all the pixels PIX. By a voltage applied to the liquid crystal capacitor CL, the transmissivity or reflectance of the liquid crystals is modulated, and an image is displayed.

In conventional active matrix type LCD devices, an amorphous silicon thin film formed on a transparent substrate of glass or the like is used as a material of the pixel transistor SW. Also, the scan driver GD and the data driver SD in conventional active matrix type LCD devices have been implemented by external integrated circuits (ICs), respectively.

However, these days, to respond to demands for improvement in driving force of pixel transistors to keep up with larger-sized screens, reduction in mounting cost of driver ICs, or for reliability in mounting, pixel arrays and driver circuits are formed monolithically by using a polysilicon thin film.

With a view to realizing even larger screens and further cost reduction of LCDs, there have been attempts to form such devices as field effect transistors with a polysilicon thin film on the glass substrate at process temperatures below the glass distortion point (about 600° C.).

FIG. 21 shows an active matrix type LCD device 200 in which a pixel array and drivers are formed monolithically.

In this active matrix type LCD device 200, a pixel array ARY, a scan driver GD and a data driver SD are mounted on an insulative substrate SUB, and a timing signal generator CTL and a supply voltage generator VGEN are each connected to the scan driver GD and the data driver SD.

The data driver SD receives signals such as a video signal DAT. In FIG. 21, paths along which the video signal DAT and the like are transferred within the data driver SD are depicted in broken line.

The scan driver GD receives signals such as a pulse signal GPS. In FIG. 21, paths along which the pulse signal GPS and the like are transferred within the scan driver GD are depicted in broken line.

As the data driver, there have been known data drivers of the dot sequential drive system and data drivers of the line sequential drive system, differing from each other depending on the method of writing a video signal into video signal lines. In polysilicon TFT panels in which the data driver has been integrated, the data driver of the dot sequential drive system is often used for the sake of configurational simplicity of the data driver.

Now the construction of a typical data driver of the dot sequential drive system is explained with reference to FIG. 22.

FIG. 22 shows a data driver SD of the dot sequential drive system. In the dot sequential drive system, sampling switches AS are opened and closed in synchronization with output pulses from individual stages (latch circuits) of a shift register circuit SFC, which is made up of a plurality of latch circuits LATA, LATB. By the sampling switches AS being opened and closed, a video signal DAT supplied to the video signal line is written into the data signal lines SL.

As shown in FIG. 22, a buffer circuit BFC1 is located between the shift register circuit SFC and the sampling switches AS. The buffer circuit BFC1 fetches a pulse signal output from the shift register circuit SFC, and retains and amplifies the pulse signal and moreover, as required, generates an inverted signal of the pulse signal.

The construction of the scan driver is explained below with reference to FIG. 23.

FIG. 23 shows a scan driver GD. This scan driver GD has a shift register circuit SFC composed of a plurality of latch circuits LATA and LATB, and a buffer circuit BFC2.

The scan driver GD amplifies output pulse signals (or logical operation results with other signals if required) of individual stages (latch circuits) of the shift register circuit SFC, which is composed of the plurality of latch circuits LATA, LATB, and then, outputs the amplified output pulse signals as scan signals.

As described above, both of the data driver SD and the scan driver GD use a shift register circuit SFC for sequentially transferring pulse signals.

FIG. 24 shows a shift register circuit SFC. As shown in FIG. 24, a plurality of latch circuits LATA, LATB are alternately connected to one another in series. In FIG. 24, a start signal ST corresponds to the signal SSP of FIG. 22 and the signal GSP of FIG. 23, and a clock signal CLK corresponds to the signal SCK of FIG. 22 and the signal GCK of FIG. 23.

FIG. 25B shows the clock signal CLK to be supplied to the shift register circuit SFC shown in FIG. 24. In addition to the clock signal CLK, a clock signal/CLK inverted in phase relative to the clock signal CLK is also supplied to the shift register circuit SFC shown in FIG. 24.

FIG. 26 shows the latch circuit LATA forming part of the shift register circuit SFC. FIG. 27 shows the latch circuit LATB forming part of the shift register circuit SFC.

Each of the latch circuit LATA and the latch circuit LATB has one inverter and two clocked inverters CICA and CICB. Clock signals CLK and/CLK opposite in phase to each other are supplied to the two clocked inverters CICA and CICB.

FIG. 28 shows the clocked inverter CICA, and FIG. 29 shows the clocked inverter CICB. For example, in the clocked inverter CICA, when the clock signal CLK is at a high level, an inverted signal of a signal supplied to an input terminal IN of the clocked inverter CICA is output from an output terminal OUT of the clocked inverter CICA. Also, in the clocked inverter CICB, when the clock signal CLK is at a low level, an inverted signal of a signal supplied to an input terminal IN of the clocked inverter CICB is output from an output terminal OUT of the clocked inverter CICB.

It is noted that in referring to a shift register circuit or a latch circuit in the present specification and the accompanying drawings, because clock signals opposite in phase to each other are supplied to those circuits, the description therefor is, in some cases, made by using only one CLK of these clock signals.

In the shift register circuit SFC shown in FIG. 24, because the clock signals CLK, /CLK are supplied to all the latch circuits LATA, LATB, the load of the clock signal lines CLKL, /CLKL becomes extremely large. As a result, external ICs (controller IC and the like) having large driving power need to be used in order to drive the clock signal lines CLKL, /CLKL, which would lead to increase in fabricating costs of the LCD device as well as increase in power consumption of the LCD devices.

Japanese Patent Laid-Open Publication HEI 3-147598 (JP-A-3-147598) discloses an arrangement that only when output of stages (latch circuit) of the shift register circuit is significant (active), the clock signal is supplied to those latch circuits in order to reduce the load of the clock signal lines.

More specifically, it is controlled by output signals of the individual latch circuits (or a sum signal of output signals of a plurality of adjacent latch circuits) whether or not the clock signal line and the latch circuit are disconnected from each other.

However, in such an arrangement, upon power-on, since the internal node state (voltage level) of the shift register circuit is unstable (meaning that the internal node can take any state), it could be the case, in the worst, that all the internal nodes of the shift register circuit go active at the power-on. This state will continue until a signal corresponding to the inactive state scans all the stages of the shift register circuit (i.e., until the shift register circuit is initialized).

Further, in that state, since the clock signal has been supplied to all the latch circuits, the load of the clock signal lines has become extremely large, as compared with the normal state (i.e., a state in which a clock signal is supplied to one to a few latch circuits when one pulse signal scans the shift register circuit).

Therefore, with insufficient driving power (i.e., with the external IC optimized for small load), the clock signal lines could not be driven within a specified time duration, in which case the shift register circuit might be disabled.

Accordingly, the external IC for supplying the clock signal is required to have such power as to enable the driving even for such a large load, whereas in the normal state, the load is small and such a large driving power is unnecessary. That is, the external IC needs to have a large driving power only for the initialization of the shift register circuit upon power-on, which has been an obstacle to an progress toward lower cost and lower power consumption.

Japanese Patent Laid-Open Publication HEI 7-147659 (JP-A-7-147659) discloses a liquid crystal panel driver which drives an LCD device to perform black display in upper and lower parts of its screen. The term "black display" refers to a display as shown in FIG. 32. In this liquid crystal panel driver, based on a vertical synchronous signal Vsync, a timing control circuit generates a gate clock signal GCLK, the frequency of which is same as the clock rate of an input video signal during the video effective period, as shown in FIGS. 33A, 33B and 33C. Meanwhile, during a return period between the video effective periods (vertical scan periods), the frequency of the gate clock signal GCLK is higher than the horizontal synchronous frequency. Then, during the return period, a black level is given to a data driver as a video signal. In this way, necessary black display is performed during a short return period.

As is well known, liquid crystals need to be driven by AC voltage. Therefore, most liquid crystal panel drivers implement the drive by inverting the polarity of a voltage to be applied, every vertical scan line. In the aforementioned liquid crystal panel driver, for implementation of black display for a total of N horizontal lines in an upper black display area located in the upper part of the screen and a lower black display area in the lower part of the screen, the N horizontal lines are scanned during the return period as shown in FIGS. 33A–33C. However, in the case where the voltage to be applied is inverted in polarity every vertical scan line as described above, if the black display area is increased so that the value of N is increased, the frequency of the applied voltage becomes extremely high. In this case, it is difficult to accomplish the polarity inversion every vertical scan line. Thus, in such a case, the applied voltage will have to be inverted every black display area, although this may cause occurrence of flickers.

Each time one vertical scan line is selected, a video signal of the black level voltage is output from the data driver. However, the output time of the black level voltage becomes shorter as N becomes larger, which makes it impossible to write the black level voltage enough into the vertical scan lines. Therefore, for example, whereas a black level voltage sampled by the data driver is written into pixels, as it is, at the first horizontal line out of n horizontal lines of the upper black display area, the sampled black level voltage would gradually decrease at the following horizontal lines so that the black level voltage would largely differ between the first horizontal line and the nth horizontal line. As a result, as shown in FIG. 34, uniform solid black display is not performed in the black display area, but gradations appear.

SUMMARY OF THE INVENTION

The present invention has been made to solve the above problems, and it is a first object of the present invention to provide an improvement on a shift register circuit arranged such that a clock signal is supplied locally for alleviation of the load on the clock signal line, the improvement being capable to operate normally even upon power-on, and also to provide an image display device which is provided with the improved shift register as part of a driver to realize reduction in power consumption and costs In order to achieve the object, a shift register circuit according to an aspect of the present invention comprises a plurality of latch circuits connected in series to sequentially transfer a pulse signal from one to another, a clock signal line transmitting a clock signal, and a plurality of switching circuits performing electrical connection and disconnection between the clock signal line and the plurality of latch circuits, and upon power-on, at least one of the switching circuits electrically disconnects at least one corresponding latch circuit from the clock signal line. In this shift register circuit, potentials at nodes of the plurality of latch circuits vary in accordance with the pulse signal transferred. The plurality of switching circuits each connect or disconnect corresponding latch circuits to or from the clock signal line in accordance with the potentials at the nodes of the corresponding latch circuits.

In this shift register circuit, in which the clock signal is selectively supplied to only an active latch circuit and its neighboring latch circuits, the potential levels of the internal nodes of, for example, all the latch circuits are initialized upon turning on the power. The internal nodes of the shift register tend to become unstable especially immediately after the power is turned on. By limiting the initialization of the potential levels to the power-on time, there is no possibility that the initialization affects an operation in a normal operation period. With this arrangement, the load of the clock signal line is reduced, so that an external IC supplying a clock signal is not required to have a very large drive power. As a result, it is possible to produce such external ICs at lower costs and reduce power consumption.

Furthermore, in this shift register circuit, in at least part of a period in which the pulse signal is transferred from a first latch circuit through a last latch circuit, the clock signal has a frequency which is lower than in a normal operation period and which gradually increases. Such a control of the clock signal for the initialization of the shift register circuit is achieved only by changing a timing (frequency) of a clock signal supplied from outside, and without requiring any additional circuit specialized for the initialization. Because the frequency of the clock signal used for the initialization is made to gradually increase, it is possible to complete the initialization in a shorter time than when a constant low frequency is used. Accordingly, other operations do not suffer from any restrictions or obstructions.

In order to achieve the above object, there is also provided a shift register circuit, comprising:
a plurality of latch circuits connected in series to sequentially transfer a pulse signal from one to another;
a clock line transmitting a clock signal; and
a plurality of switching circuits performing electrical connection and disconnection between the clock line and the plurality of latch circuits, wherein
at least one of the switching circuits electrically disconnects at least one of the plurality of latch circuits from the clock line at regular intervals.

In this shift register circuit as well, potentials at nodes of the plurality of latch circuits vary in accordance with the pulse signal transferred, and the plurality of switching circuits may connect or disconnect corresponding latch circuits to or from the clock line in accordance with the potentials at the nodes of the corresponding latch circuits. Then, in at least part of a period in which the pulse signal is transferred from a first latch circuit through a last latch circuit, the clock signal may preferably have a frequency lower than in a normal operation period. In addition, preferably, the frequency of the clock signal may gradually increases in the at least part of the period.

In the shift register circuits according to the first and second aspects of the invention, the frequency of the clock signal in the at least part of the period can be from $\frac{1}{2}$ to $\frac{1}{16}$ of a frequency of the clock signal in the normal operation period.

Because the time during which the shift register operates at such a low frequency of the clock signal is not very long, it is possible to suppress influences of the operation at the low frequency upon other operations. A frequency which is $1/n$ ($n$ is an integer) of an original frequency can be readily obtained by frequency-dividing a normal clock signal.

In either of the above shift register circuits, each latch circuit may have an internal node initialization circuit to which an initialization signal is supplied from outside. The initialization circuit will initialize the internal node of the latch circuit in response to the initialization signal. With such an arrangement, all the latch circuits can be initialized at the same time. Thus, the initialization time can be made shorter, and advantageously, it is less possible that the initialization operation affects other operations.

The clock signal may have an amplitude smaller than an amplitude of a power-supply voltage of the shift register circuit. With this arrangement, a device size of the latch circuit receiving the clock signal tends to be large and thus the load is also large accordingly. In this case, adopting the design to supply the clock signal selectively to the latch circuits is very effective and advantageous.

Either of the above shift register circuits may have a buffer circuit supplying the plurality of latch circuits with a clock signal received from outside. With this arrangement, by inputting only one of clock signals from outside, its inverse signal can be generated internally. Accordingly, this arrangement is effective in reducing terminals and external ICs. The size (drive power) of the buffer circuit depends on the load of the clock signal line. Therefore, reduction of the effective load will reduce the size of the buffer circuit.

Furthermore, in either of the above shift registers, the clock signal received from outside may have an amplitude different from an amplitude of the clock signal supplied to the plurality of latch circuits, and the shift register circuit may further comprise a level shifter changing the amplitude of the clock signal received from outside. The size of such a level shifter and of the buffer circuit, which may be placed after the level shifter, depends on the load of the clock signal line. Accordingly, reduction of the effective load will lead to reduction of the size of the level shifter and/or the buffer circuit. Provision of the level shifter in the shift register circuit allows the voltage level of an input signal thereto to be lower than a drive voltage of the shift register circuit. Thus, it is possible to dispense with an external level shifting IC, which will lead to reduction of the external power consumption.

According to a further aspect of the present invention, there is provided an image display device of active matrix type comprising any one of the aforementioned shift register circuit. More specifically, the image display device comprises:

a plurality of pixels arranged in a matrix form;

a data signal line supplying video data to be written to one of the plurality of pixels;

a scan signal line for controlling the writing of the video data to one of the plurality of pixels;

a data driver supplying the video signal to the data signal line in synchronization with a timing signal; and a scan driver supplying a pulse signal to the scan signal line in synchronization with a timing signal, wherein at least one of the data driver and the scan driver comprises any one of the above shift register circuits.

For the reasons described above, if the scan driver has the shift register, it is possible to keep down the driving power of the external IC driving the clock signal line to be input to the scan driver while achieving a normal operation of the shift register circuit. Accordingly, it is possible to realize a high-definition image display device which is produced at lower costs and consumes less electricity.

Similarly, if the data driver has the shift register, it is also possible to keep down the driving power of the external IC driving the clock signal line to be input to the data driver while achieving a normal operation of the shift register circuit. Accordingly, it is possible to realize a high-definition image display device which is produced at lower costs and consumes less electricity. In particular, in the case of the data driver, which is a part having a highest operational frequency in the image display device, reduction of the load of the clock signal line has a large effect.

In one embodiment, the potential levels at each of the internal nodes of all the latch circuits in the shift register circuit of the data driver are initialized in synchronization with a vertical synchronous signal. With such an arrangement, either the vertical synchronous signal or a start signal for the scan driver generated from the vertical synchronous signal can be used as a signal triggering the initialization, so that no additional signal is required.

In one embodiment, active devices included at least in the data driver comprise polysilicon thin-film transistors. Because the transistors are formed of a polysilicon thin-film, they have a characteristic of extremely high driving power, as compared with amorphous silicon thin-film transistors. As a result, in addition to the foregoing effects and advantages, there is an additional advantage that it is easy to form the pixels and the data driver on a same substrate. Thus, it is expected that production costs and assembly costs are reduced and that the non-defective assembly rate is increased. Furthermore, the driving power of the polysilicon thin-film transistor is smaller than the driving power of the amorphous silicon thin-film transistor by one or two orders of magnitude. Therefore, if the polysilicon thin-film transistors are used for both the scan driver and the data driver, it is necessary to form the transistors in increased size. This will lead to increase in the load of the clock signal line. Thus, the arrangement of this embodiment, from which the above effects are anticipated, is very effectual. If the polysilicon thin-film transistors are used further for the level shifter and/or the buffer circuit for the clock signal line, the initialization intended for decrease of the load of the clock signal line is very effectual and advantageous.

If the polysilicon thin-film transistors are formed at a process temperature of 600° C. or lower, it is possible to use glass which has a low distortion temperature, but is cheap and easy to form a larger substrate. Accordingly, in addition to the above advantages, it is possible to, advantageously, produce a large-sized image display device at lower costs.

A second object of the present invention is to provide a driving method for LCD devices which enables high-definition black display in, for example, upper and lower positions of a screen and which prevents drivers from malfunctioning.

In order to achieve the object, according to a further aspect of the present invention, there is provided a driving method for an active-matrix liquid crystal display device, in which a pixel electrode is connected to a data signal line by a switching device based on a control signal supplied from a scan driver, and a data signal output from a data driver is supplied to the pixel electrode through the data signal line, so that a picture based on the data signal is displayed by a pixel matrix, wherein:

in performing black display in an upper black display area provided in an upper position of a screen and in a lower black display area provided in a lower position of the screen, a stabilization period is provided, in one vertical scan period, between a first black display period in which black display is performed in the upper black display area and a video display period in which video display is performed in a video display area below the upper black display area and between the video display period and a second black display period in which black display is performed in the lower black display area below the video display area, the stabilization period being a period in which a frequency of a clock signal for operating a shift register included in the data driver is made lower than a frequency of the clock signal in the video display period such that a potential level at an internal node of the shift register is stabilized.

This driving method is applicable to, for example, LCD devices having the conventional circuitry as shown in FIGS. 19 and 20.

With this driving method, in one vertical scan period, a stabilization period is provided between the video display period in which a picture is displayed in a middle zone of the screen and each of the first and second black display periods in which a black color is displayed in the upper and lower zones of the screen, respectively, and the frequency of the clock signal in the data driver is made lower in the stabilization period than in the video display period, whereby the potential level of an internal node of the shift register circuit in the data driver is stabilized. In this way, in a plurality of latch circuits included in the shift register, potential levels at their internal nodes are prevented from becoming unstable.

If the frequency of the clock signal of the data driver in the stabilization period is from ½ to ⅟32 of a frequency in the video display period, it is possible to surely stabilize all the internal nodes in the shift register circuit of the data driver.

If a frequency of a clock signal in the scan driver is made higher in the black display periods than in the video display period, it is possible to surely display the black color in the upper and lower black display areas. Further, if an analog switching section included in the data driver to sample the data signal is always placed in an on state during the black display periods, horizontal lines in the black display areas will have an identical potential level. As a result, an uniform and stable black display is achieved.

In one embodiment, the frequency of the clock signal for operating the shift register circuit in the scan driver in the first and second black display periods is 1.5–10 times as high as the frequency in the video display period With this arrangement, in displaying a picture at an aspect ratio of about 16:9 on a screen of an aspect ration of about 4:3, it is possible to well and surely perform a black display in the upper and lower black display areas and a video display in the video display area. In addition, polarity inversion of a voltage applied to the data signal line is well performed.

The driving method of the invention can be used not only in an LCD device having shift register circuits both of which require stabilization of the internal node potential level, but also in an LCD device having shift register circuits both of which require no stabilization of the internal node potential level, and in an LCD device having both a shift register requiring stabilization of the internal node potential level and a shift register requiring no stabilization of the internal node potential level as well.

In other words, the driving method of the invention can be used for an LCD device wherein at least one of a scan driver and a data driver has a shift register which comprises a plurality of latch circuits connected in series to transfer a pulse signal from one to another in synchronization with a clock signal and is designed such that the clock signal is supplied to only a latch circuit in which a pulse of the pulse signal is present and its neighboring latch circuits, as well as for an LCD device wherein at least one of a scan driver and a data driver has a shift register designed such that the clock signal is supplied to all the latch circuits.

Other objects, features and advantages of the present invention will be obvious from the following description.

BRIEF DESCRIPTION OF THE DRAWINGS

FIGS. 2A, 2B and 2C show supply voltage Vcc, an example of a clock signal CLK supplied to the shift register circuit, and a clock signal CLKint inside the shift register circuit, respectively;

FIGS. 3A, 3B and 3C show supply voltage Vcc, an example of a clock signal CLK supplied to the shift register circuit with the use of a clock signal supplying IC having large driving power, and a clock signal CLKint inside the shift register circuit, respectively;

FIGS. 6A and 6B show supply voltage Vcc and a clock signal whose frequency at power-on is lower than its frequency at an end of the initialization period, respectively;

FIGS. 7A, 7B and 7C show supply voltage Vcc, a pulse signal PLS and another example of the clock signal for driving the shift register circuit;

FIGS. 10A, 10B and 10C show supply voltage Vcc, and an example of a reset signal RST and an example of the clock signal CLK with the use of the latch circuits shown in FIGS. 8 and 9, respectively;

FIGS. 11A, 11B and 11C show supply voltage Vcc, and another example of the reset signal RST and another example of the clock signal CLK with the use of the latch circuits shown in FIGS. 8 and 9, respectively;

DETAILED DESCRIPTION OF THE PREFERRED EMBODIMENTS

Figure 1:
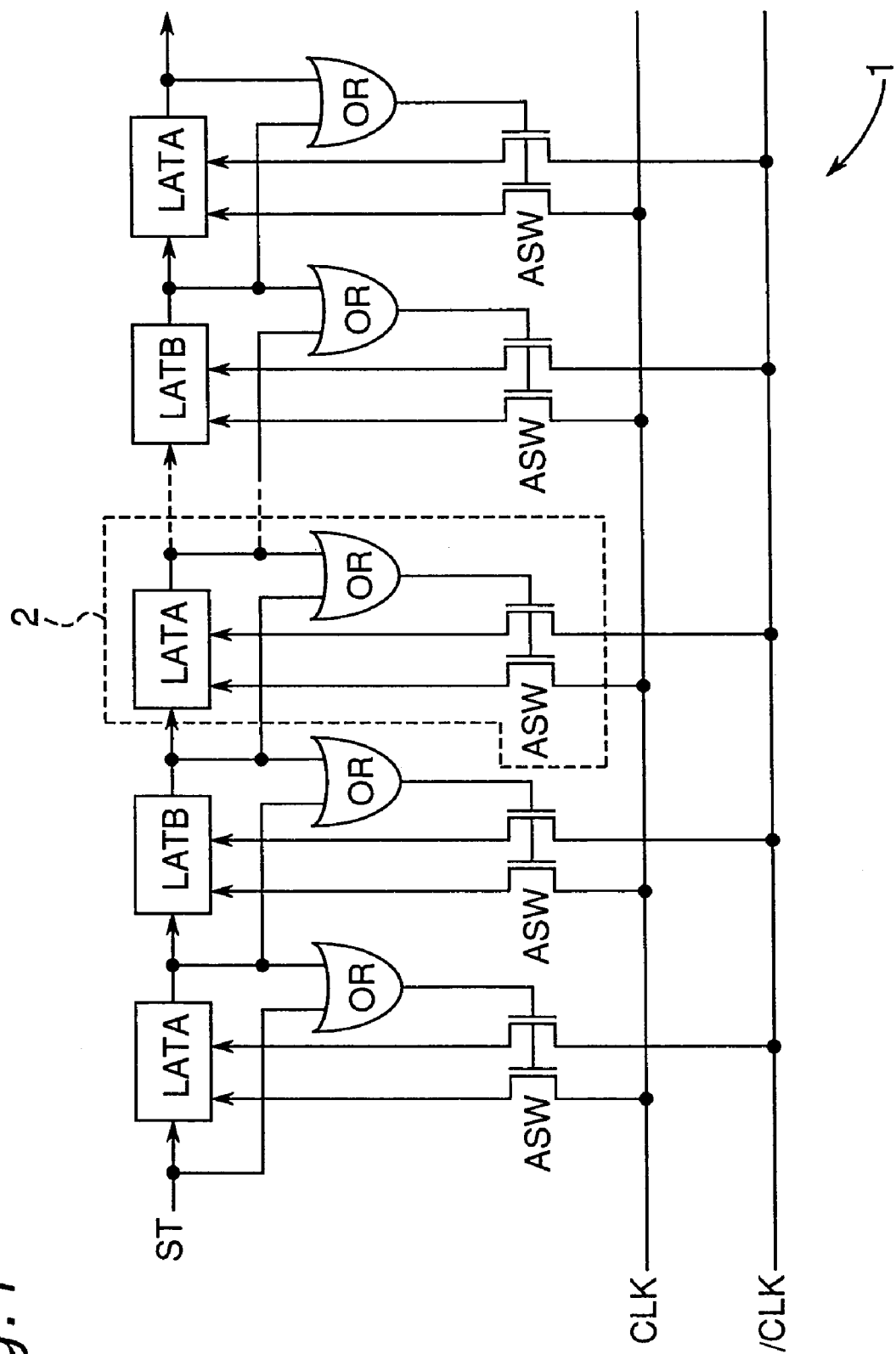
FIG. 1 shows a shift register circuit according to an embodiment of the invention.

FIG. 1 shows a shift register circuit 1 according to an embodiment of the invention.

Figure 26:
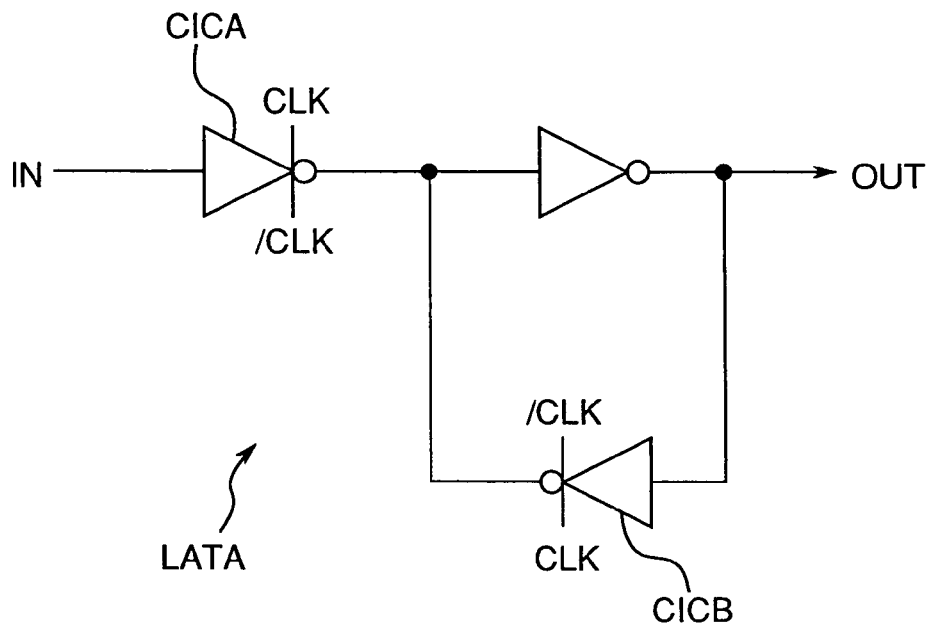
FIG. 26 shows a latch circuit partly constituting the shift register circuit of FIG. 24.
Figure 27:
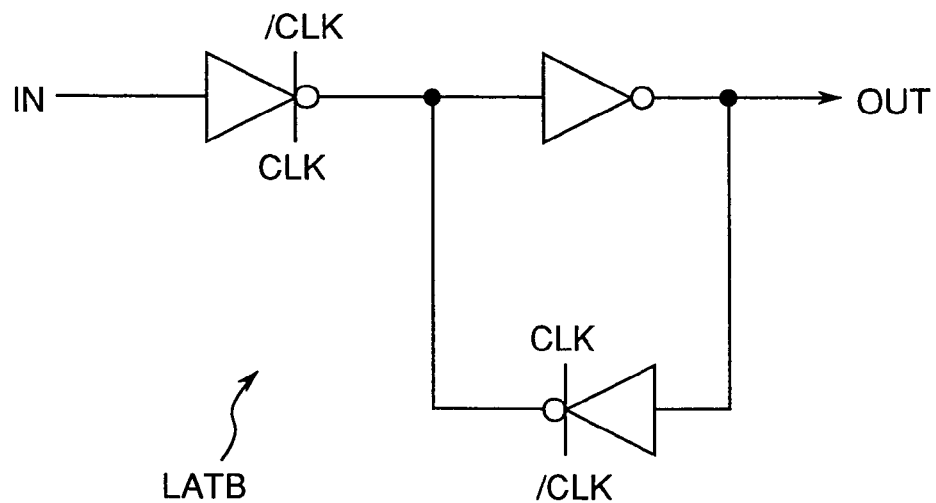
FIG. 27 shows another latch circuit partly constituting the shift register circuit of FIG. 24.
Figure 28:
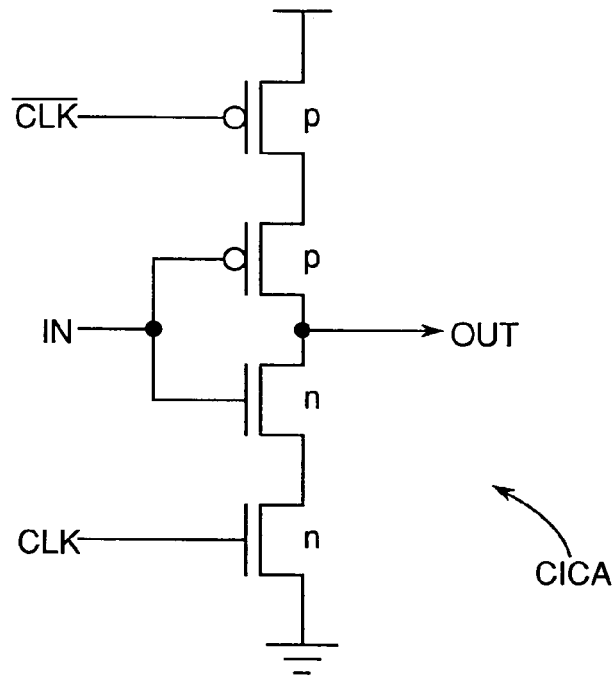
FIG. 28 is a circuit diagram of a clocked inverter used in the latch circuits of FIGS. 26 and 27.
Figure 29:
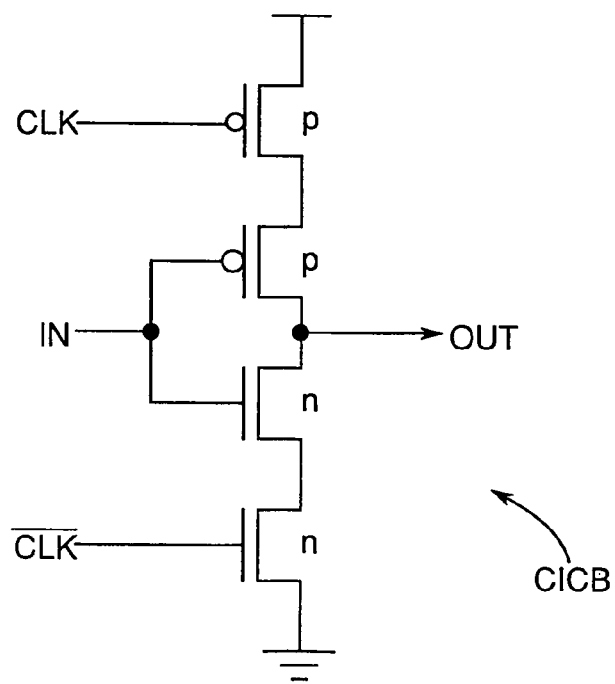
FIG. 29 is a circuit diagram of another clocked inverter used in the latch circuits of FIGS. 26 and 27.

The shift register circuit 1 is made up of a plurality of latch circuits LATA, LATB having the arrangement shown in FIGS. 26 and 27, a plurality of logical OR circuits OR, and a plurality of switches ASW. The foremost latch circuit of the shift register circuit 1 shown in FIG. 1 may be either a latch circuit LATA or a latch circuit LATB, and this is determined depending on an input clock signal.

It is controlled by the logical OR circuits OR and the switches ASW whether or not clock signals CLK, /CLK are input to the latch circuits LATA, LATB. For example, a logical OR circuit OR belonging to one unit 2 receives a signal output from a latch circuit of a preceding stage to a latch circuit belonging to the one unit 2 as well as a signal output from the latch circuit belonging to the one unit 2, and then computes a logical OR of those signals. Based on a signal which indicates a result of the computation, a switch ASW belonging to the one unit 2 goes conducting, or closed, so that clock signals CLK, /CLK are supplied to the latch circuit belonging to the one unit 2.

Figure 24:
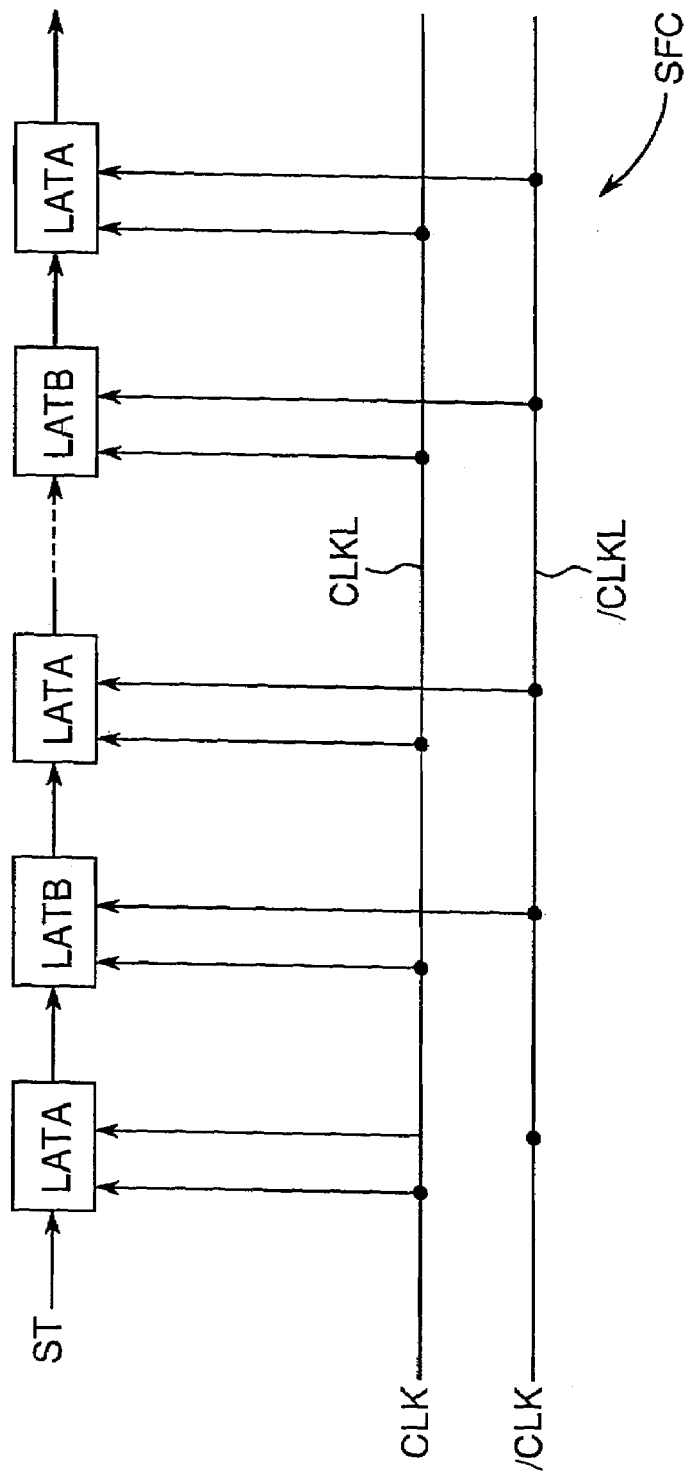
FIG. 24 shows a conventional shift register circuit.
Figures 25A, 25B:
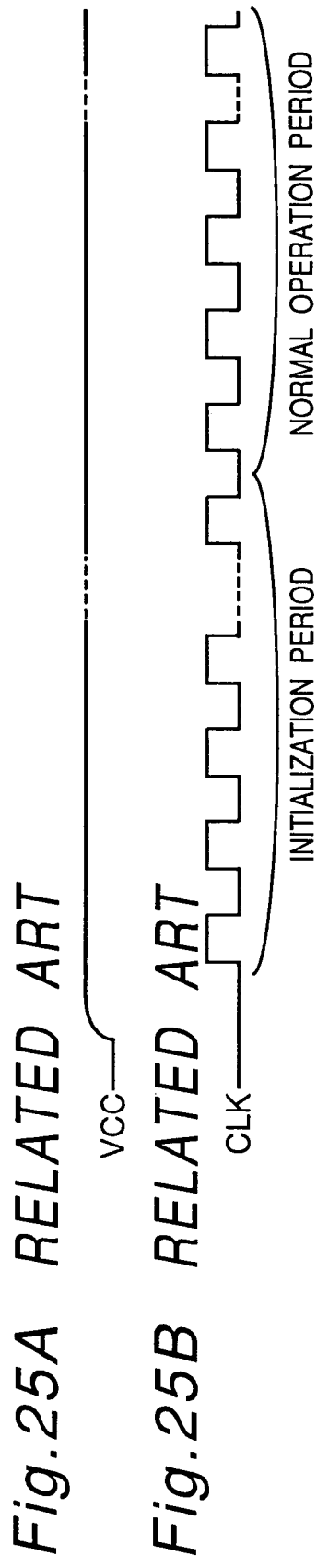
FIGS. 25A and 25B show supply voltage and a clock signal CLK supplied to the shift register circuit shown in FIG. 24, respectively.

That is, a clock signal is input into a latch circuit belonging to one unit 2 only when at least one of this latch circuit or a latch circuit of the preceding stage is active. By this arrangement, most of the latch circuits are disconnected from the clock signal lines CLKL, /CLKL. As a result of this, loads of the clock signal lines CLKL, /CLKL become very small, compared with the shift register circuit SFC shown in FIG. 24. Therefore, the shift register circuit 1 is allowed to use a clock signal supply IC of small driving power.

However, as described before, at power-on, the state (potential level) of internal nodes of the latch circuits LATA, LATB becomes unstable. That is, the internal nodes of the latch circuits LATA, LATB can take any state.

For this reason, there is a fear that all or most of the nodes of the latch circuits LATA, LATB become active. If all the nodes of the latch circuits LATA, LATB become active, the clock signal lines CLKL, /CLKL are connected to all the latch circuits LATA, LATB. The load of the clock signal lines CLKL, /CLKL in the state that all the latch circuits LATA, LATB are active is very large, as compared with the other states.

If all the nodes of the latch circuits LATA, LATB are active, there is a possibility that a clock signal supply IC having such a driving power as to only perform a normal operation can no longer drive the shift register circuit. This is explained in more detail with reference to FIGS. 2A–2C.

FIGS. 2A, 2B and 2C show a supply voltage, an example of a clock signal CLK supplied to the shift register circuit 1 and a clock signal CLKint inside the shift register circuit, respectively.

In the state that the nodes of all the latch circuits LATA, LATB are active, because of a large load of the clock signal lines CLKL, /CLKL, the clock signal CLKint inside the shift register circuit shown in FIG. 2C is dulled in waveform, as compared with the clock signal CLK supplied to the shift register circuit. On this account, an amplitude enough to drive the shift register circuit cannot be ensured. As a result, the shift register circuit would not operate. In other words, the level of the internal nodes of the latch circuits LATA, LATB does not change. Therefore, the load of each of the clock signal lines CLKL, /CLKL continues assuming a large value, so that the shift register circuit cannot start operating.

However, in the case of large load of the clock signal lines CLKL, /CLKL, if a clock signal supply IC having such power as can drive the clock signal lines CLKL, /CLKL is used, the shift register circuit operates. FIGS. 3B and 3C show an example of the clock signal CLK supplied to the shift register circuit with the use of a clock signal supplying IC having large driving power, and the clock signal CLKint inside the shift register circuit, respectively.

Such large driving power is not required in a normal operating state, only entailing an increase in power consumption. Besides, a clock signal supply IC having large driving power naturally has a demerit of high cost.

Figure 4A:
FIGS. 4A and 4B show supply voltage Vcc and a clock signal CLK received by the shift register circuit, respectively.
Figure 4B:
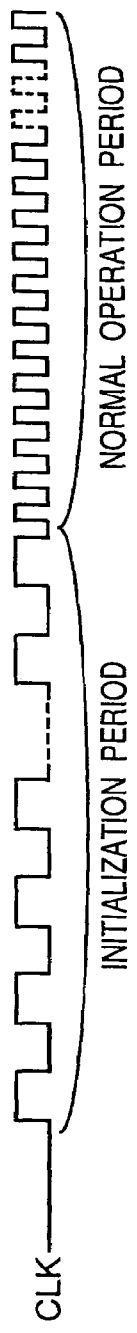

By lowering the frequency of the clock signal CLK during the initialization period below the frequency of the clock signal CLK during the normal operation period without changing the crest to trough ratio of pulses as shown in FIG. 4B, the problem that an amplitude large enough to drive the shift register circuit cannot be ensured can be solved even if a clock signal supply IC having small driving power is used. The term "initialization period", in this embodiment, refers to a time period corresponding to a specified time elapse from power-on. The term "normal operation period" refers to periods other than the initialization period.

Figure 5A:
FIGS. 5A, 5B, 5C and 5D show supply voltage Vcc, a pulse signal PLS, an example of the clock signal CLK and an example of the clock signal CLKint inside the shift register circuit during an initialization period and a normal operation period, respectively.
Figure 5B:
Figure 5C:
Figure 5D:
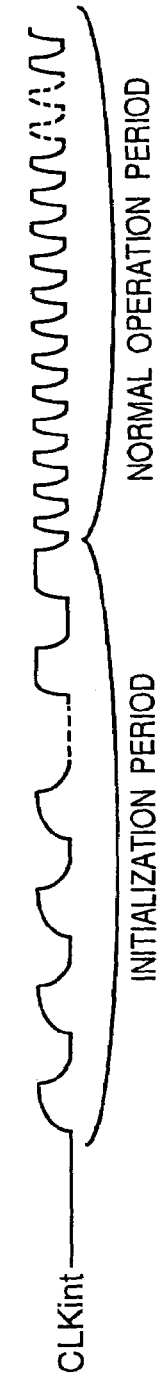

FIGS. 5C and 5D show an example of the clock signal CLK and an example of the clock signal CLKint inside the shift register circuit 1 during the initialization period and the normal operation period. As shown in FIGS. 5C and 5D, the leading edge of the clock signal CLKint indeed is not sharp due to the load of the clock signal lines CLKL, /CLKL, yet it becomes over a specified level (threshold), so that the shift register circuit operates normally.

Also, the shift register circuit 1, upon entering the initialization period, reduces the clock frequency for a specified period. On this account, even if all the latch circuits LATA, LATB are active, the latch circuits LATA, LATB are disconnected from the clock signal lines CLKL, /CLKL successively from the first stage as the shift register circuit 1 is progressively initialized. Therefore, the load of the clock signal lines CLKL, /CLKL lowers gradually.

It is noted that the frequency of the clock signal lines CLKL, /CLKL at power-on is determined depending on how much the load of the clock signal lines CLKL, /CLKL increases, and generally may be about ½ to $\frac{1}{16}$ of the frequency of the clock signal lines CLKL, /CLKL during the normal operation period.

Although the frequencies of the clock signals for initialization shown in FIGS. 4 and 5 are constants the frequency of the clock signal does not necessarily need to be constant. For example, the frequency of the clock signal for initialization may vary gradually.

FIG. 6B shows a clock signal CLK whose frequency at power-on is lower than the frequency at an end of an initialization period. As an example, the clock frequency at power-on is ⅛ the frequency of the clock signal CLK during the normal operation period, the frequency of the clock signal CLK gradually increases, and the clock frequency at the end of the initialization becomes the frequency of the clock signal CLK during the normal operation period.

For example, even if all the latch circuits LATA, LATB are active, the latch circuits LATA, LATB are disconnected from the clock signal lines CLKL, /CLKL successively from the first stage on as the shift register circuit 1 is progressively initialized, so that the load of the clock signal lines CLKL, /CLKL becomes gradually smaller. Therefore, even with increasing frequency, the shift register circuit can sufficiently be driven. By gradually increasing the frequency of the clock signal lines CLKL, /CLKL, the initialization period required for the initialization can be shortened. The frequency of the clock signals may be increased either continuously or discontinuously in several clock pulses.

FIG. 7C shows another clock signal for driving the shift register circuit 1.

In the clock signal shown in FIG. 7C, the frequency is decreased in synchronization with an arbitrary pulse signal PLS supplied cyclically (FIG. 7B) and the decreased frequency is kept for a specified period. Therefore, the shift register circuit 1 is initialized every cycle. Even with the use of a clock signal supply IC having small driving power, the shift register circuit 1 operates normally. The cycle time may be a period for one frame of a picture.

Figure 8:
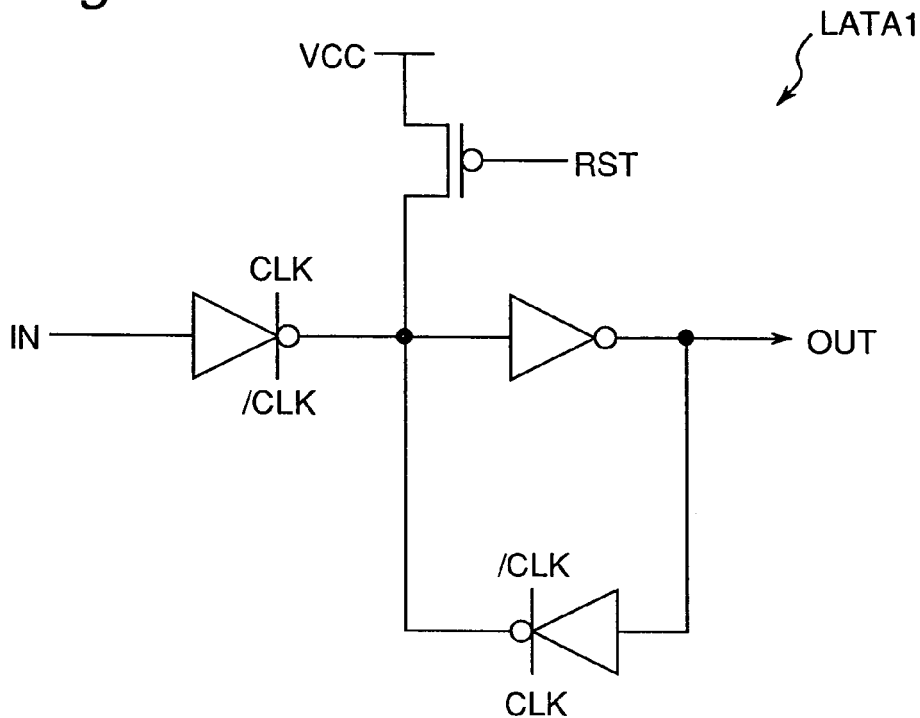
FIG. 8 shows an example of circuitry of the latch circuit in the shift register circuit.
Figure 9:
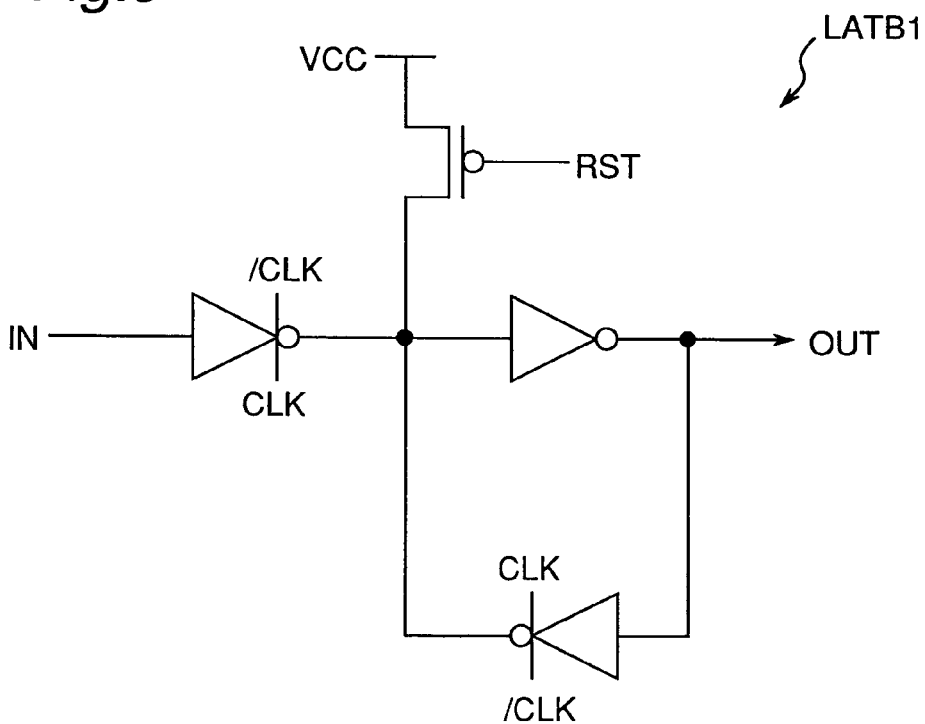
FIG. 9 shows another example of circuitry of the latch circuit in the shift register circuit.

FIGS. 8 and 9 show other examples of the latch circuits of the shift register circuit 1 as LATA1, LATB1.

In the latch circuits LATA1, LATB1, the internal nodes are forcedly reset. As a result of the reset, for example, signals output from the latch circuits go low level.

FIGS. 10B, 10C and FIGS. 11B, 11C show clock signals CLK and reset signals RST for the latch circuits LATA1, LATB1.

In the example of the signal waveform shown in FIGS. 10A–10C, the reset signal RST is supplied to the latch circuits LATA1, LATB1 only when power is turned on, whereby the internal nodes of those latch circuits are initialized.

In the example of the signal waveform shown in FIGS. 11A–11C, the reset signal RST is supplied to the latch circuits LATA1, LATB1 in synchronization with the pulse signal PLS supplied cyclically at regular intervals, whereby the internal nodes of those latch circuits are initialized.

As described above, by initializing the shift register circuit 1, it becomes possible for the shift register circuit 1 to implement normal operation even with the use of a clock signal supply IC having small driving power.

The cycle time may be a time period for one frame of a picture, as already described.

Figure 12:
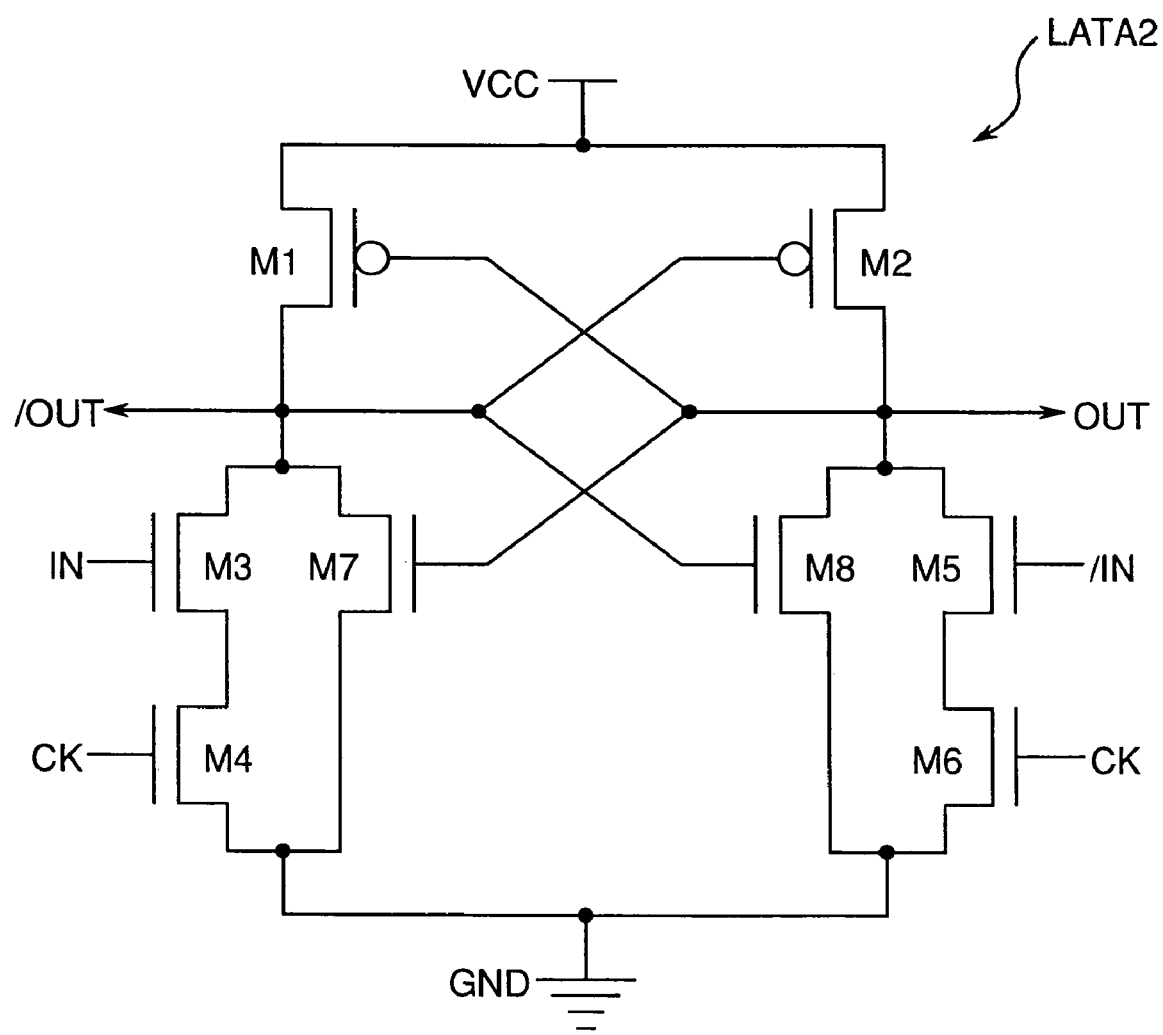
FIG. 12 shows still another example of circuitry of the latch circuit in the shift register circuit.
Figure 13:
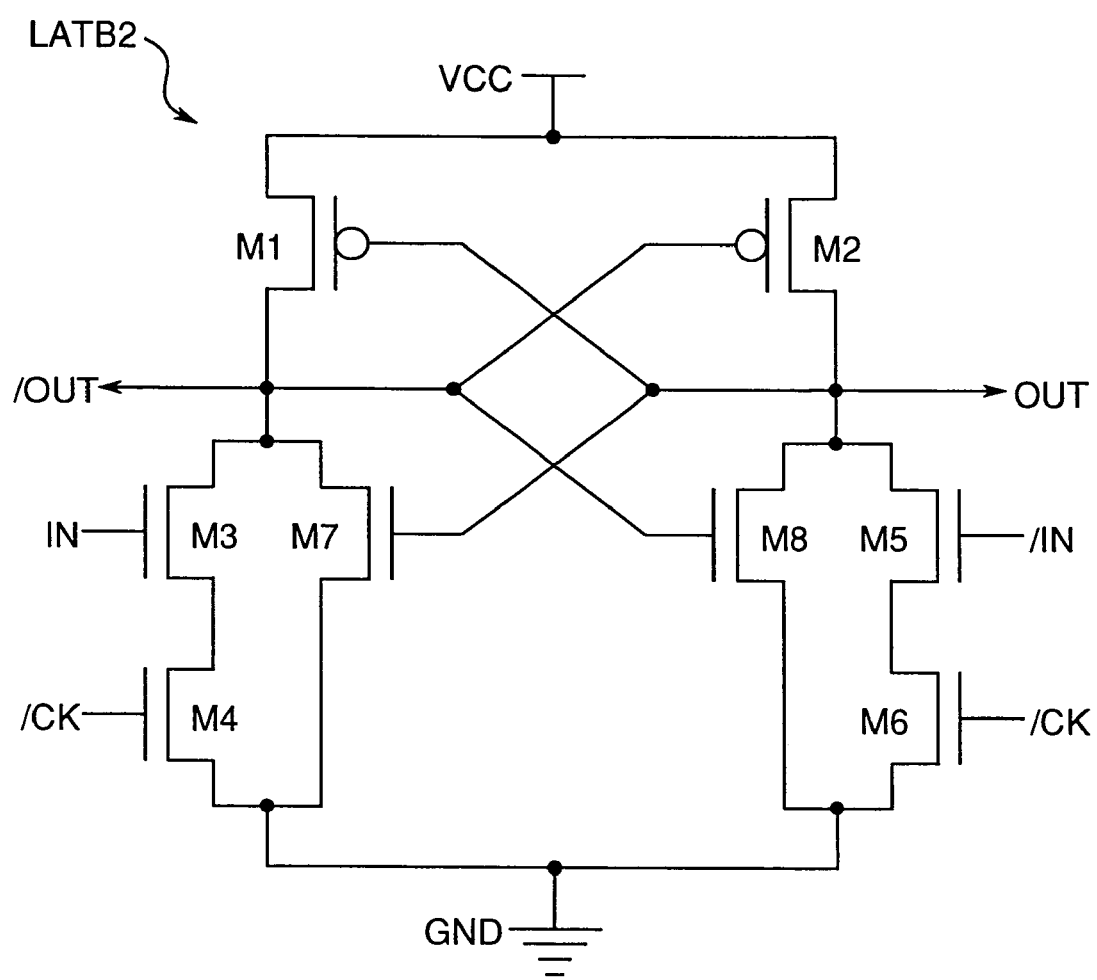
FIG. 13 shows still another example of circuitry of the latch circuit in the shift register circuit.

FIGS. 12 and 13 show other circuitry examples of the latch circuits of the shift register circuit 1 as LATA2, LATB2.

The latch circuits LATA2, LATB2 each have transistors M1–M8.

The clock signal to be supplied to the shift register circuit 1 having the latch circuits LATA2, LATB2 may be a clock signal shown in FIG. 4 or FIG. 7.

The latch circuits LATA2, LATB2 have a level shifting function. Even if a clock signal having an amplitude smaller than a voltage difference between a supply voltage Vcc and a ground voltage GND is supplied to the latch circuits LATA2, LATB2, the latch circuits LATA2, LATB2 output signals having an amplitude equal to the voltage difference between the voltages Vcc and GND.

For example, in the case where the supply voltage for the latch circuits LATA2, LATB2 is 0 V/15 V, even if the clock signal line has a 0 V/5 V amplitude, signals having a 0 V/15 V amplitude are supplied from the latch circuits LATA2, LATB2.

For the latch circuits LATA2, LATB2, it is necessary to reduce the on-resistance of the current path on the GND side. To achieve this, the size (channel width) of the transistors M4, M6, to which the clock signal is supplied, has to be increased.

This leads to quite a large magnitude of the input current to the latch circuits, as viewed from the clock signal line. Thus, reduction in signal line load by locally supplying the clock signal is very significant and advantageous in the shift register circuit of the invention.

Further, in the case where all the latch circuits are connected to the clock signal line, the effect of increase in load becomes so large that the effectiveness of the initialization of the shift register circuit becomes very large.

Figure 14:
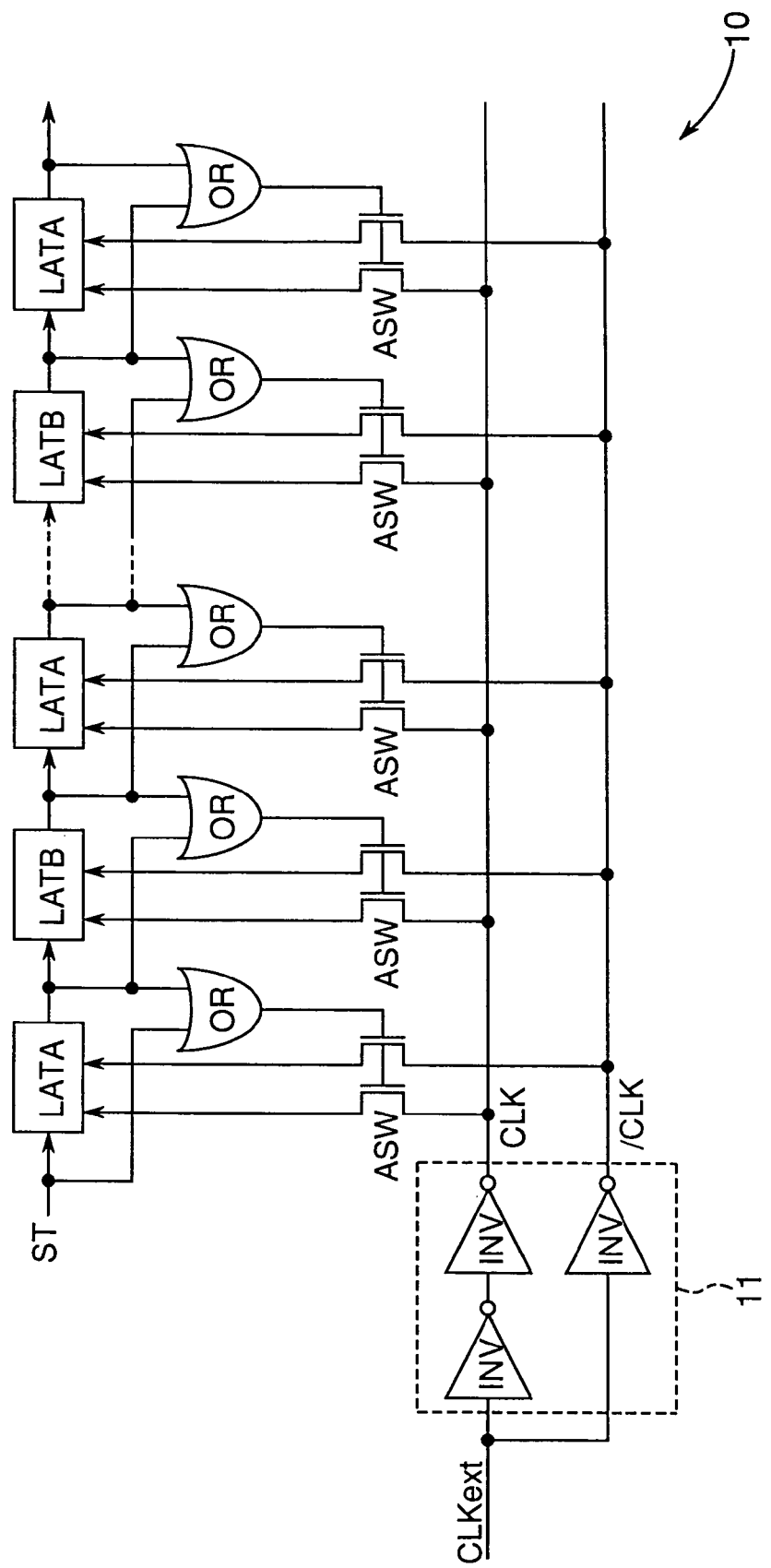
FIG. 14 shows a shift register circuit according to another embodiment.

FIG. 14 shows a shift register circuit 10 according to another embodiment.

The shift register circuit 10 has a plurality of he latch circuits LATA, LATB shown in FIGS. 26 and 27, a plurality of logical OR circuits OR, a plurality of switches ASW and a buffer circuit 11. Only a signal CLKext, which is one phase of a clock signal, is supplied to the shift register circuit 10 from outside, and clock signals CLK, /CLK are supplied to the latch circuits via the buffer circuit 11. The buffer circuit 11 has to have at least one inverter circuit INV. In this example, the buffer circuit 11 has three inverter circuits INV.

In this embodiment, since the shift register circuit 10 includes the buffer circuit 11, the number of signal lines connected to the shift register circuit 10 from external can be reduced.

Figure 15:
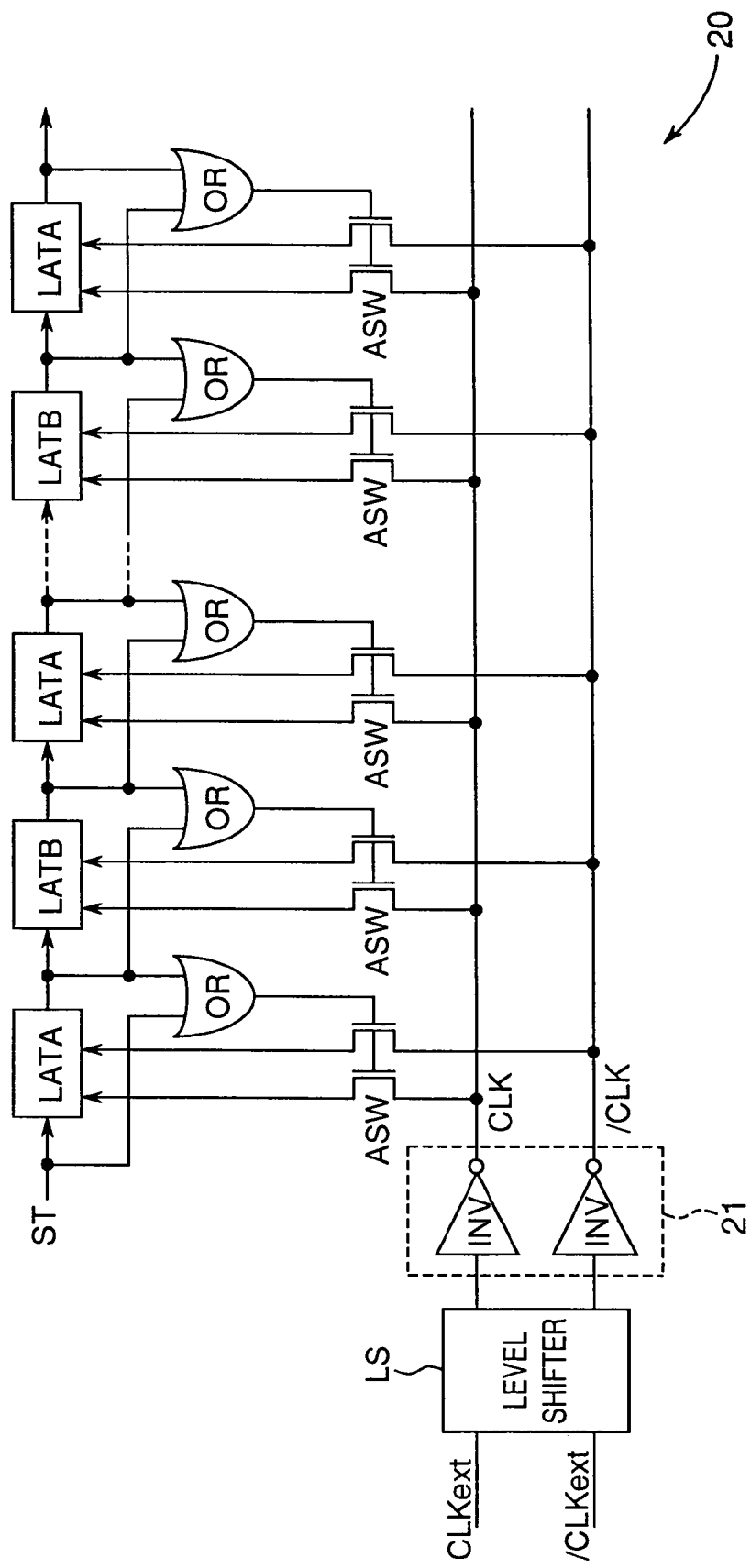
FIG. 15 shows a shift register circuit according to still another embodiment.

FIG. 15 shows still another shift register circuit 20.

The shift register circuit 20 has a plurality of latch circuits LATA, LATB shown in FIGS. 26 and 27, a plurality of logical OR circuits OR, a plurality of switches ASW, a level shifter LS, and a buffer circuit 21. The buffer circuit 21 has at least one inverter circuit INV.

External clock signals CLKext, /CLKext supplied from external to the shift register circuit 20 have amplitudes smaller than amplitudes of the clock signals CLK, /CLK supplied to the shift register circuit 1 shown in FIG. 1. The external clock signals CLKext, /CLKext supplied from external are supplied to the latch circuits LATA, LATB via the level shifter LS and the buffer circuit 21.

In the shift register circuit 20, since the clock signals supplied from external are allowed to have a small amplitude thanks to the level shifter LS, the need of providing any external level shifter IC is eliminated and besides the power consumption can be reduced.

Figure 16A:
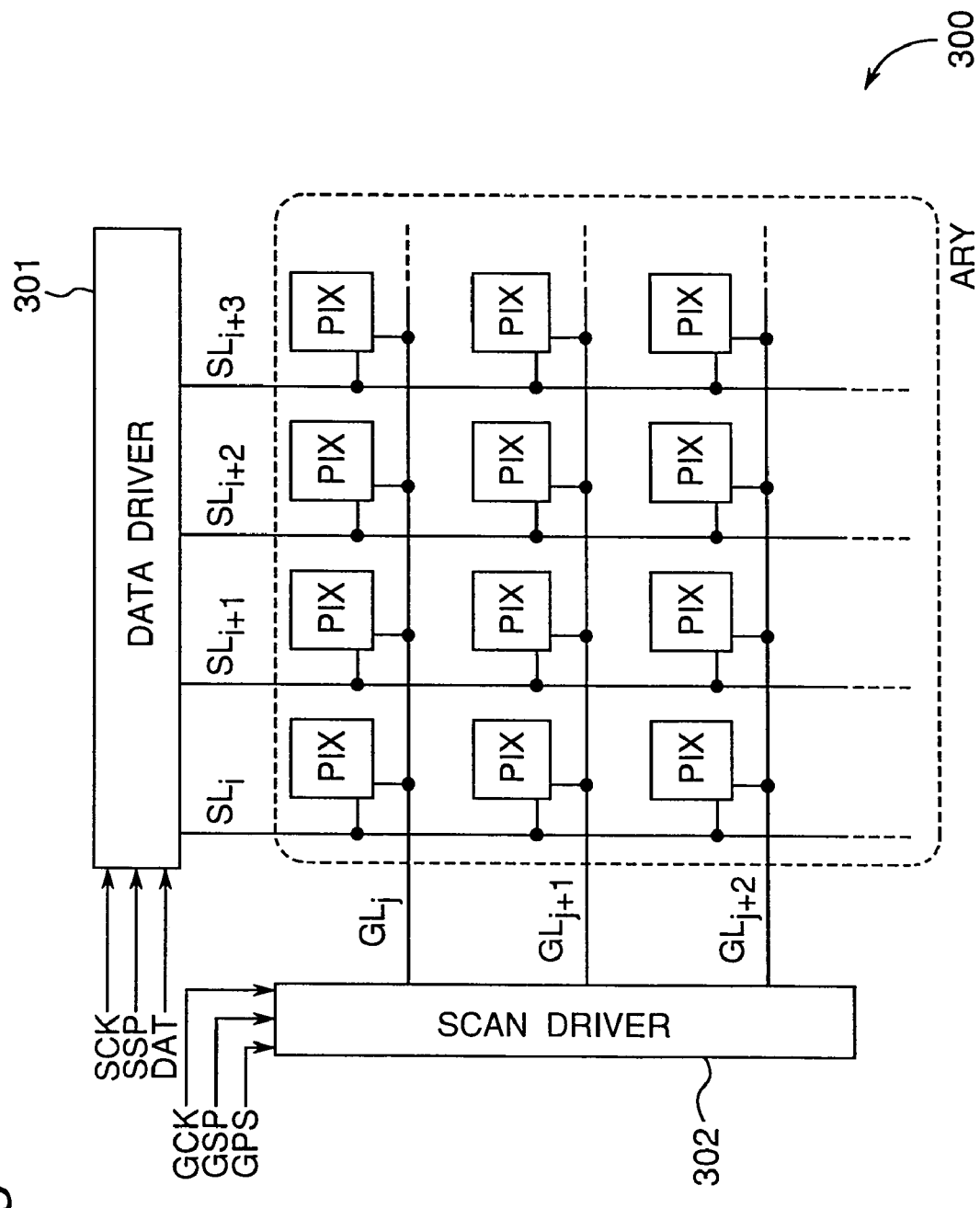
FIG. 16A shows an active matrix-driven LCD as an example of the image display apparatus equipped with the shift register circuit of the invention.

If an image display apparatus incorporates the shift register circuit 1, the shift register circuit 10 or the shift register circuit 20 in its data driver and/or scan driver, power consumption associated with the supply system for supplying clock signals can be reduced. FIG. 16A shows such an image display apparatus 300. Each of a data driver 301 and a scan driver 302 of this image display apparatus 300 has the shift register circuit 1, the shift register circuit 10 or the shift register circuit 20. The circuitry other than the data driver 301 and the scan driver 302 is same as that of the image display apparatus 100 shown in FIG. 19 and so omitted in description.

In general, the data driver is driven at frequencies several hundreds to thousands higher than that of the scan driver. Therefore, the effect of implementing the present invention in the data driver is larger than that of implementing the invention in the scan driver, although, needless to say, the invention, even when embodied with a scan driver, is advantageous.

The vertical synchronous signal for the image display apparatus (alternatively, a start pulse for the scan driver) is supplied at a frame frequency (normally, 60 Hz). Therefore, this signal may also be used as a synchronizing signal to perform the initialization of the shift register circuit cyclically at regular periods or intervals. Use of the above signal eliminates the need of inputting a signal for specifying the timing of initialization from external of the image display apparatus.

Figure 16B:
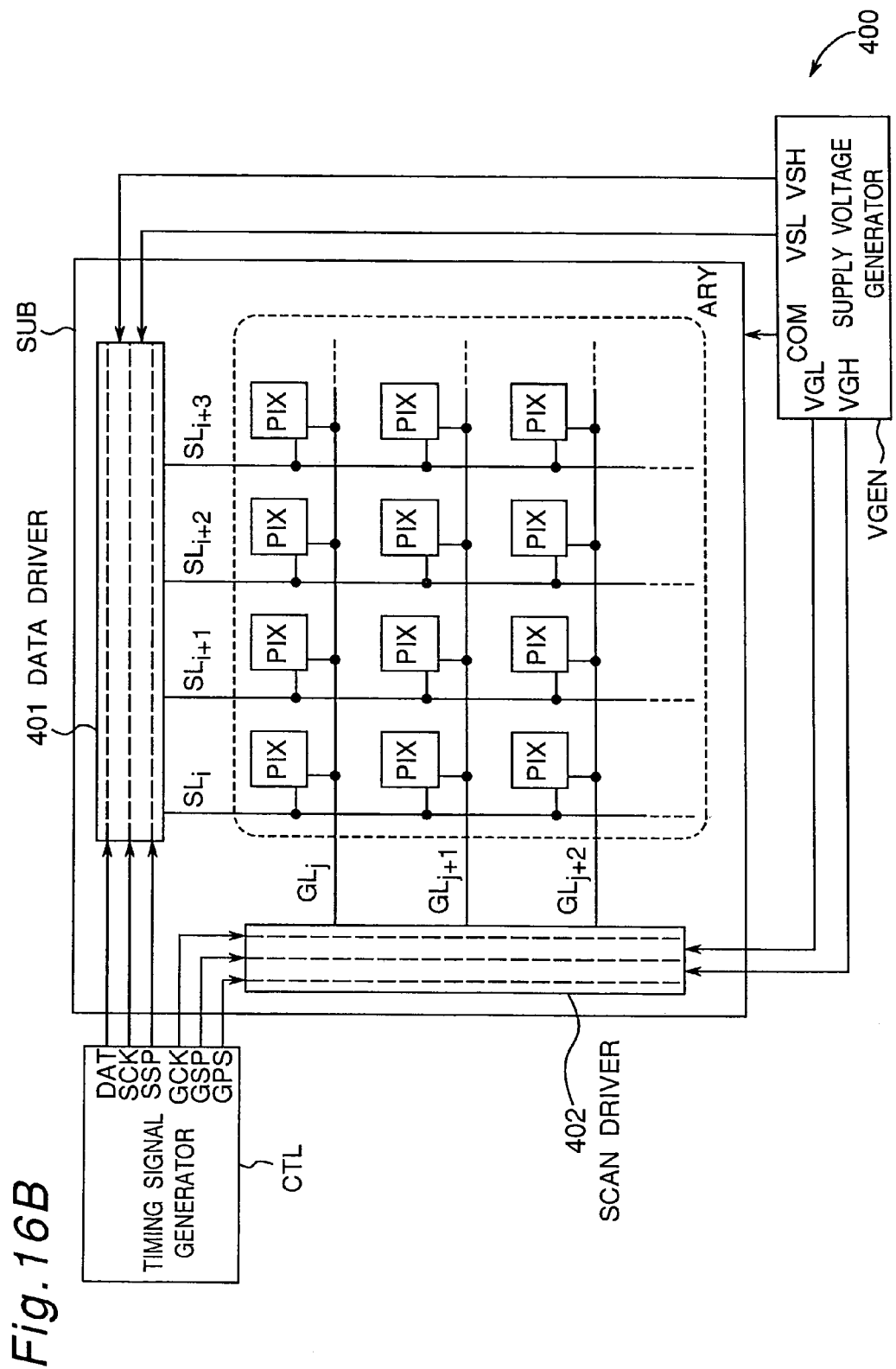
FIG. 16B shows another example of the image display apparatus equipped with the shift register circuit of the invention.
Figure 21:
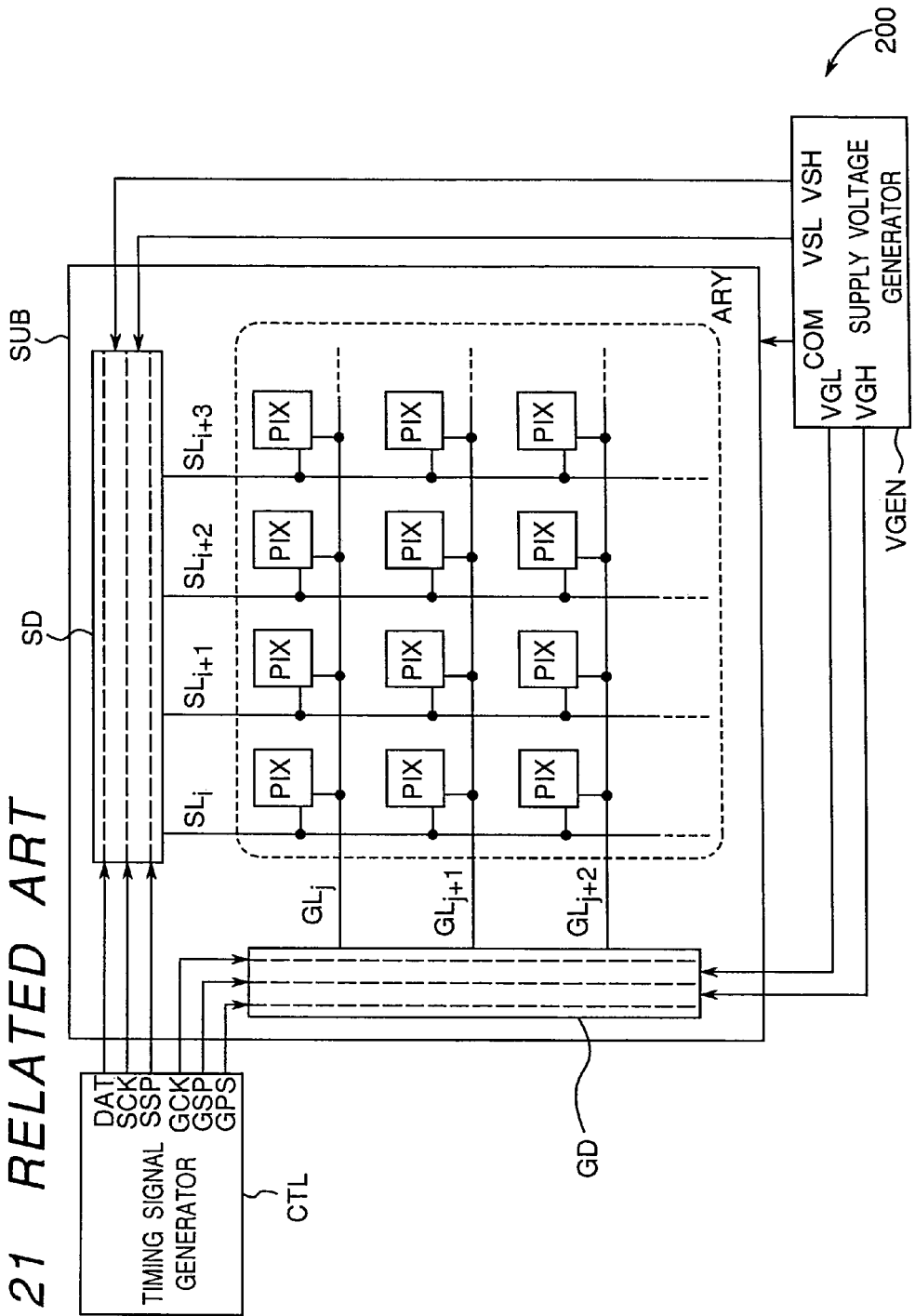
FIG. 21 shows another conventional active matrix-driven LCD device.
Figure 22:
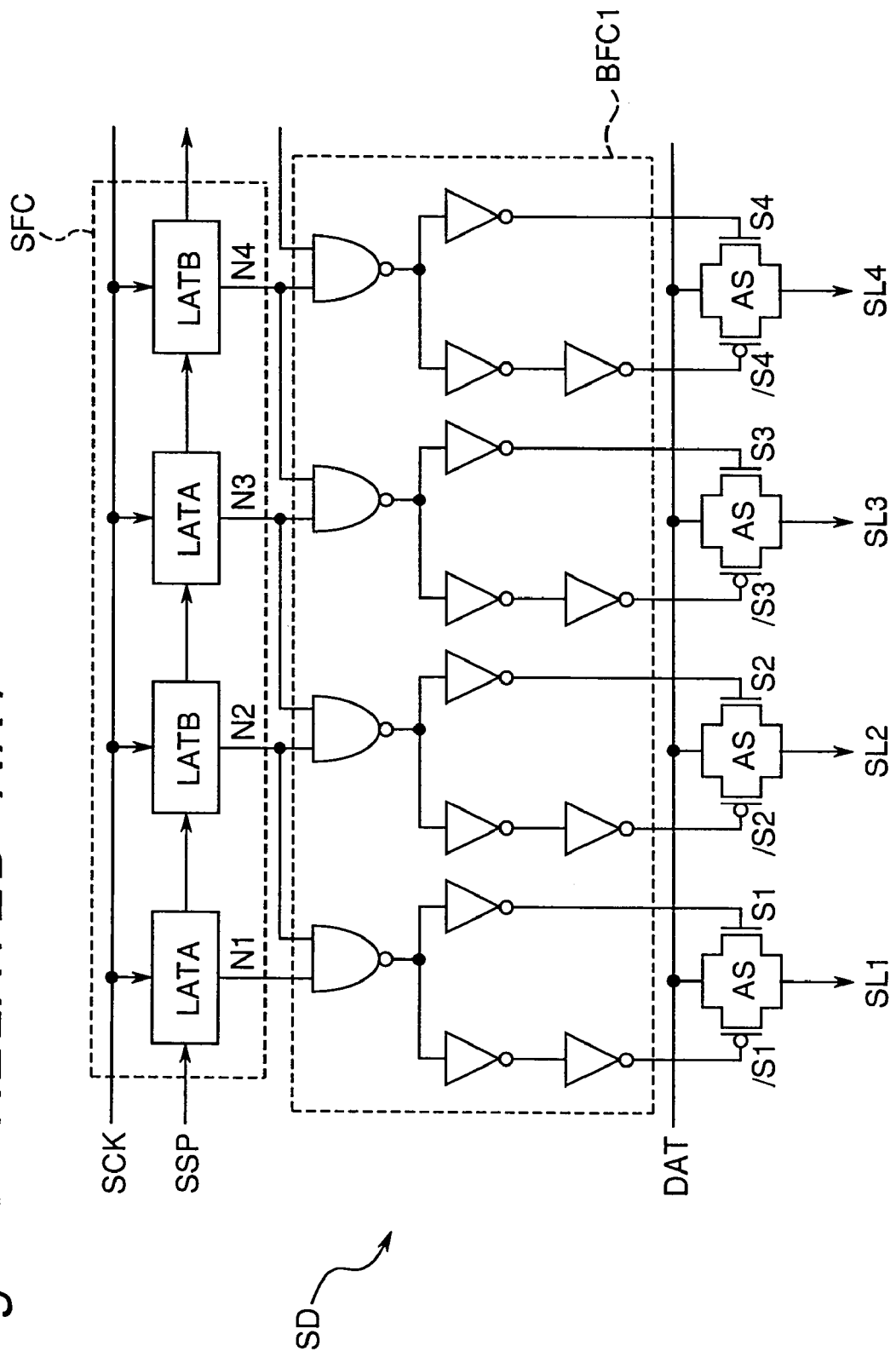
FIG. 22 shows a data driver of the dot sequential drive system.
Figure 23:
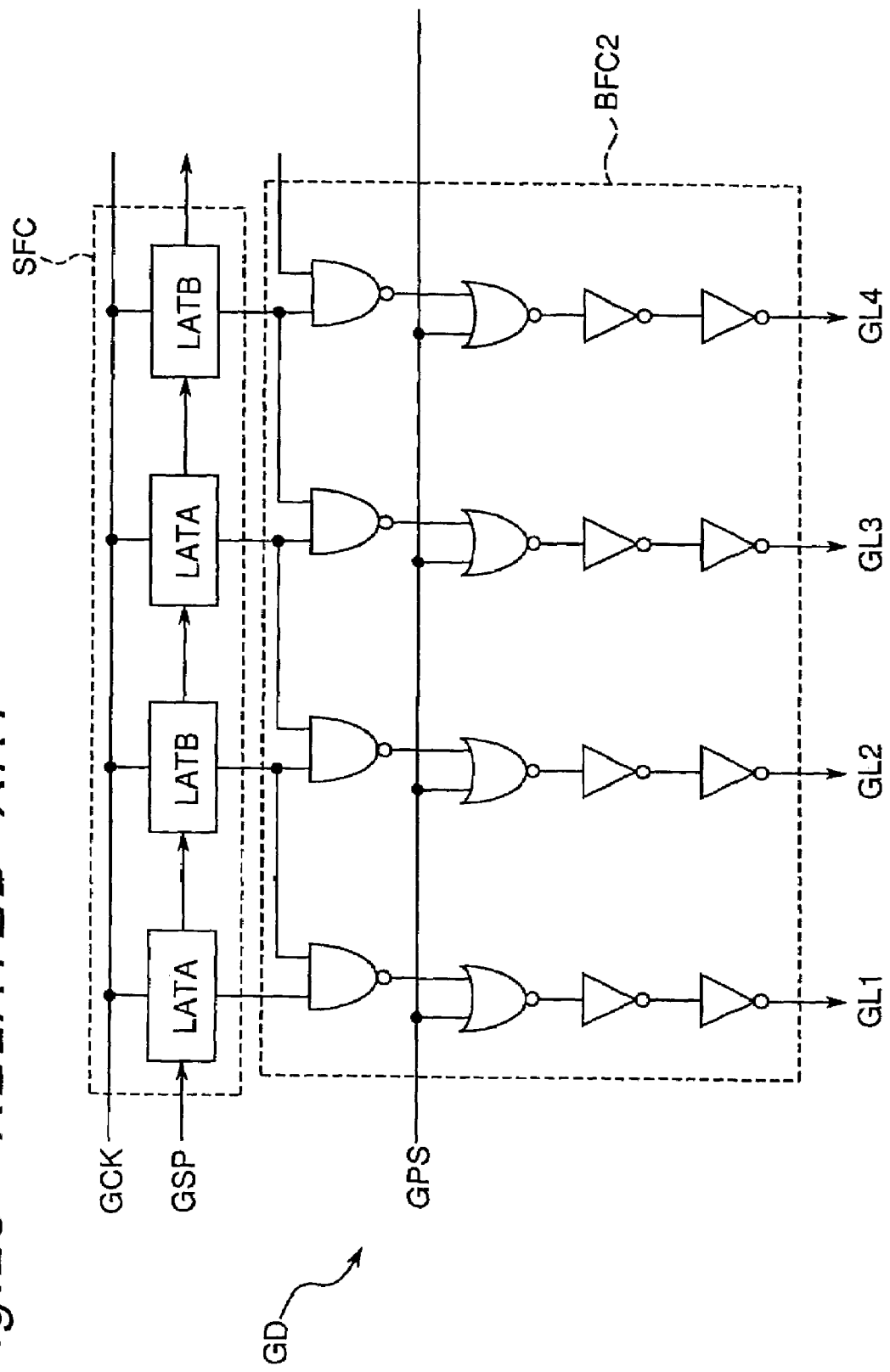
FIG. 23 shows a scan driver of the dot sequential drive system.

FIG. 16B shows an embodiment in which the invention is applied to an image display apparatus in which a data driver and a scan driver are formed on one substrate having pixels formed thereon (monolithic), like the image display apparatus shown in FIG. 21. The image display apparatus 400 of this figure has the same component parts as in the conventional image display apparatus 200 shown in FIG. 21, except a data driver 401 and a scan driver 402. Component parts similar to the conventional ones are designated by the reference numerals of FIG. 21 and a detailed description thereon is omitted. Forming the drivers and the pixels monolithic makes it possible to reduce the fabrication cost and assembly cost of the image display apparatus and to produce an effect on reliability improvement, than making and mounting the drivers and pixels separately.

In the image display apparatus 400 shown in FIG. 16B, the pixels PIX, the data driver 401 and the scan driver 402 are formed on the same substrate SUB (driver monolithic structure). The image display apparatus is driven by signals from an external control circuit CTL and driving power from an external supply voltage generator VGEN. Each of the data driver 401 and the scan driver 402 has the shift register circuit 1, the shift register circuit 10 or the shift register circuit 20 described above.

With the above constitution, the data driver 401 and the scan driver 402 are placed over a region generally equal in length to the screen (display area), and so the wiring length for clock signals and the like is extremely long.

Therefore, since the load of the clock signal lines or the like is also quite large, the effect of reducing the load of the clock signal lines by locally inputting the clock signals also becomes quite large.

Figure 17:
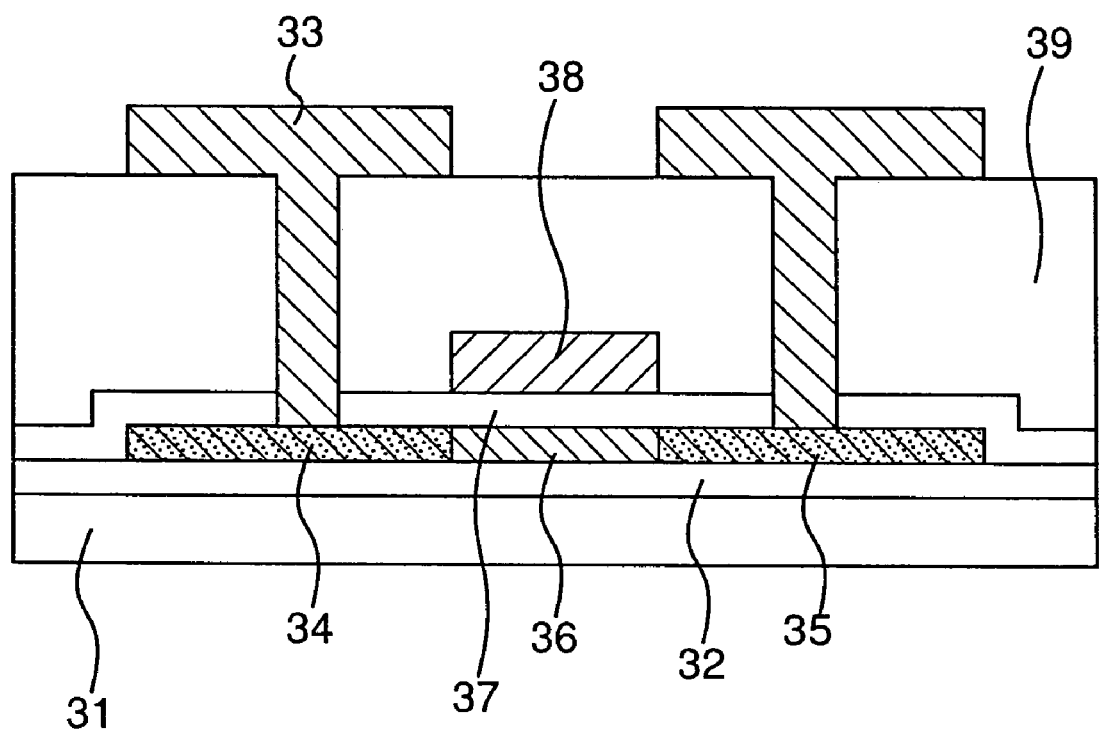
FIG. 17 is a view showing a structure example of a polysilicon thin-film transistor included in the shift register circuit according to an embodiment.

FIG. 17 is a view showing an example of the structure of a polysilicon thin-film transistor included in the shift register circuit in the image display apparatus 400.

This polysilicon thin-film transistor is essentially made up of an insulative substrate 31, silicon oxide 32, metallic wiring 33, a source region 34, a drain region 35, a polysilicon thin film 36, a gate insulator 37, a gate electrode 38 and an interlayer dielectric 39.

The polysilicon thin-film transistor is of a forward staggered (top-gate) structure using the polysilicon thin film on the insulative substrate as an active layer. However, this structure is not limitative, and the transistor may be of other structure such as a reverse staggered structure.

By using the polysilicon thin-film transistor shown in FIG. 17, a scan driver and a data driver having practical driving power can be made up on the substrate on which the pixel arrays are also formed, and by nearly the same fabrication process steps as those for the pixel arrays.

Polysilicon thin-film transistors, which are lower in driving power by one to two orders of magnitude than single crystal silicon transistors (MOS transistors), need to be increased in size in implementing a shift register circuit. Thus, the input load tends to be increased accordingly. Therefore, locally inputting the clock signals is very effective in reducing load of the clock signal lines.

Fabrication process steps of this polysilicon thin-film transistor are briefly explained with reference to FIGS. 18A–18K.

Figure 18A:
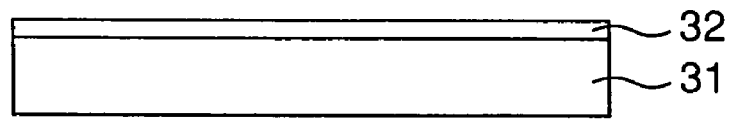
FIGS. 18A, 18B, 18C, 18D, 18E, 18F, 18G, 18H, 18I, 18J and 18K are fabrication process diagrams of the polysilicon thin-film transistor.
Figure 18B:
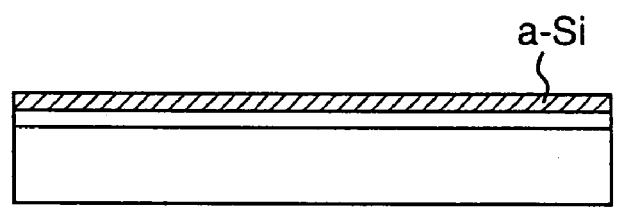
Figure 18C:
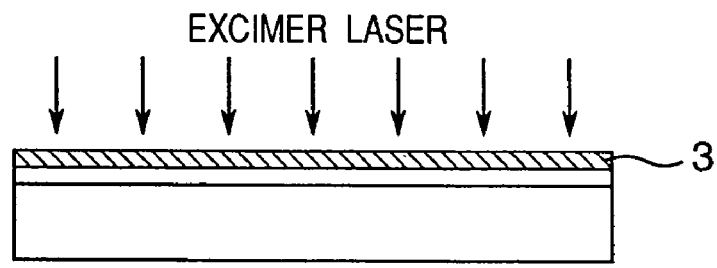
Figure 18D:
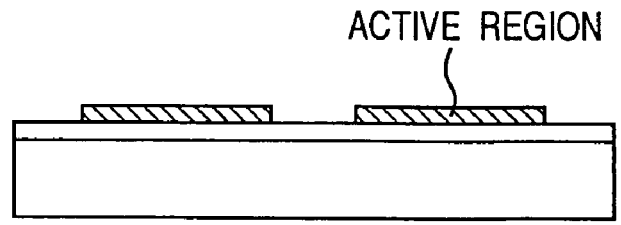
Figure 18E:
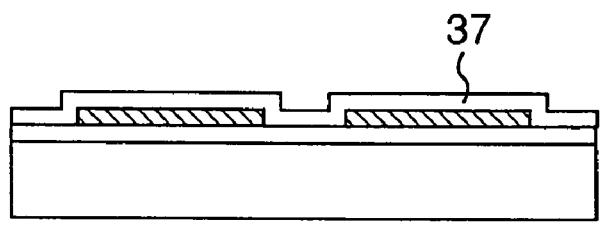
Figure 18F:
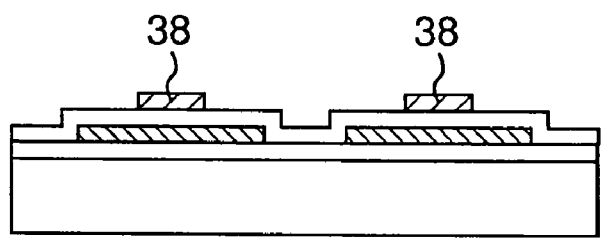
Figure 18G:
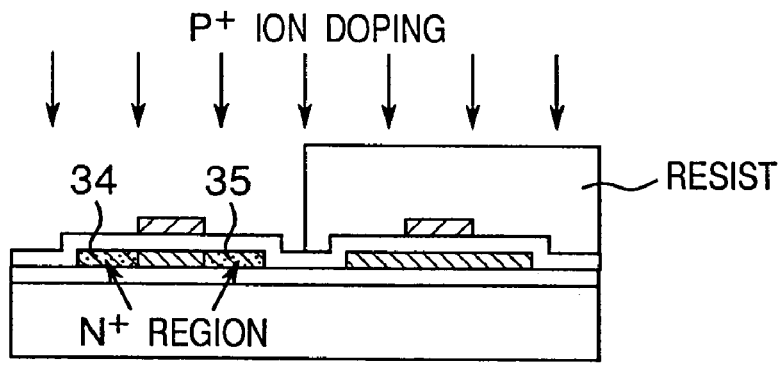
Figure 18H:
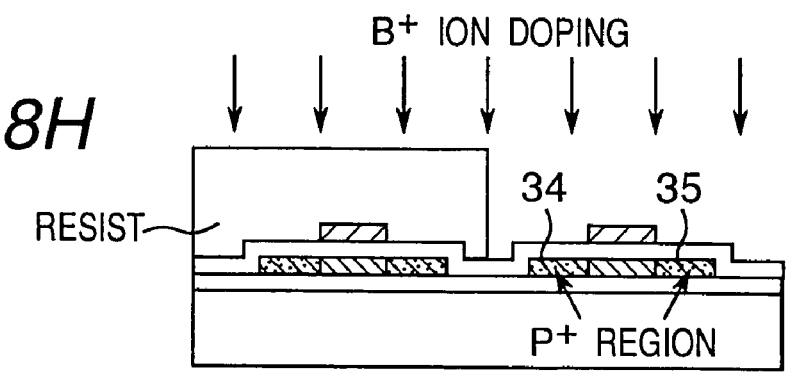
Figure 18I:
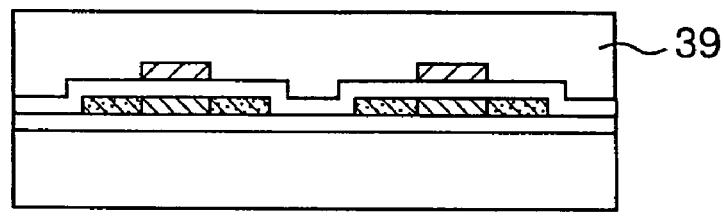
Figure 18J:
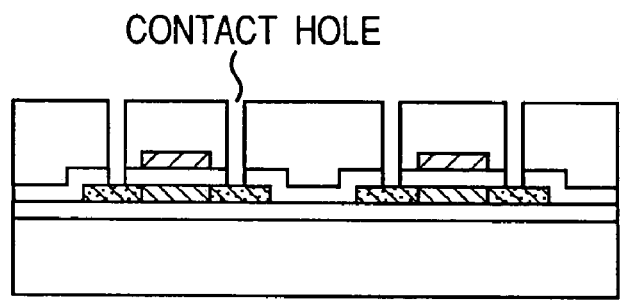
Figure 18K:
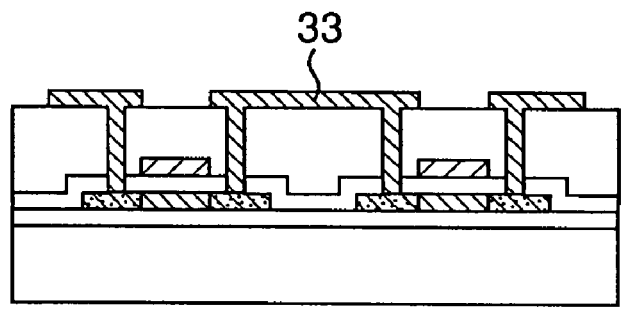

On a glass substrate 31, silicon oxide 32 is first formed and subsequently an amorphous silicon thin film is deposited (FIGS. 18A, 18B). Next, the amorphous silicon thin film is irradiated with excimer laser, forming a polysilicon thin film 36 (FIG. 18C). This polysilicon thin film 36 is patterned into a desired shape, by which an active region is formed (FIG. 18D), and then a gate insulator 37 made of silicon dioxide is formed (FIG. 18E). On this gate insulator 37, a gate electrode 38 for a thin film transistor is formed of a metal such as aluminum (FIG. 18F). Next, impurities, or dopants (phosphorus for an n-type region and boron for a p-type region) are implanted into the polysilicon thin film 36 by using a resist pattern, with the result that a source region 34 and a drain region 35 are formed (FIGS. 18G, 18H). Next, an interlayer dielectric 39 made of silicon dioxide or silicon nitride is deposited (FIG. 18I). Then, contact holes ranging to the source region and the drain region are formed in the interlayer dielectric 39 and the gate insulator 37 (FIG. 18J), and metallic wiring is formed of aluminum or the like in these contact holes (FIG. 18K). Thus, the polysilicon thin-film transistor shown in FIG. 17 is completed.

Because a temperature 600° C. used during the gate insulator formation process is the highest temperature used in the process steps shown in FIGS. 18A–18K, highly heat-resistant glasses such as 1737 Glass made by Corning Inc. of U.S. may be used as the glass substrate material.

For fabrication of an LCD, subsequent to the above process, transparent electrodes (for transmission LCDs) or reflecting electrodes (for reflection LCDs) are formed via another interlayer dielectric.

In this connection, because forming the polysilicon thin-film transistors at temperatures below 600° C. in the fabrication process as shown in FIG. 18 makes it possible to employ a low-price, large-area glass substrate, a reduction in price and an increase in area of the image display apparatus can be realized.

Although several embodiments of the invention have been shown above, the present invention is not limited to these embodiments, but applicable to other cases such as combinations of the foregoing embodiments.

The shift register circuit of the invention, although lending itself to use in various fields, has been described by taking examples of image display apparatus, particularly, LCDs hereinabove. However, the invention can also be utilized for similar objectives in other fields as well.

FIGS. 30A–30F are timing charts of signals of a scan driver and a data driver in one vertical scan period for realizing the drive method for an LCD device according to an embodiment of the invention. This embodiment is described on a case where in an LCD device having a screen aspect ratio of generally 4:3, a video signal complying with the NTSC system is displayed at an aspect ratio of generally 16:9 with black display areas provided in upper and lower parts of the screen. However, the invention is not limited to those aspect ratios.

Figure 19:
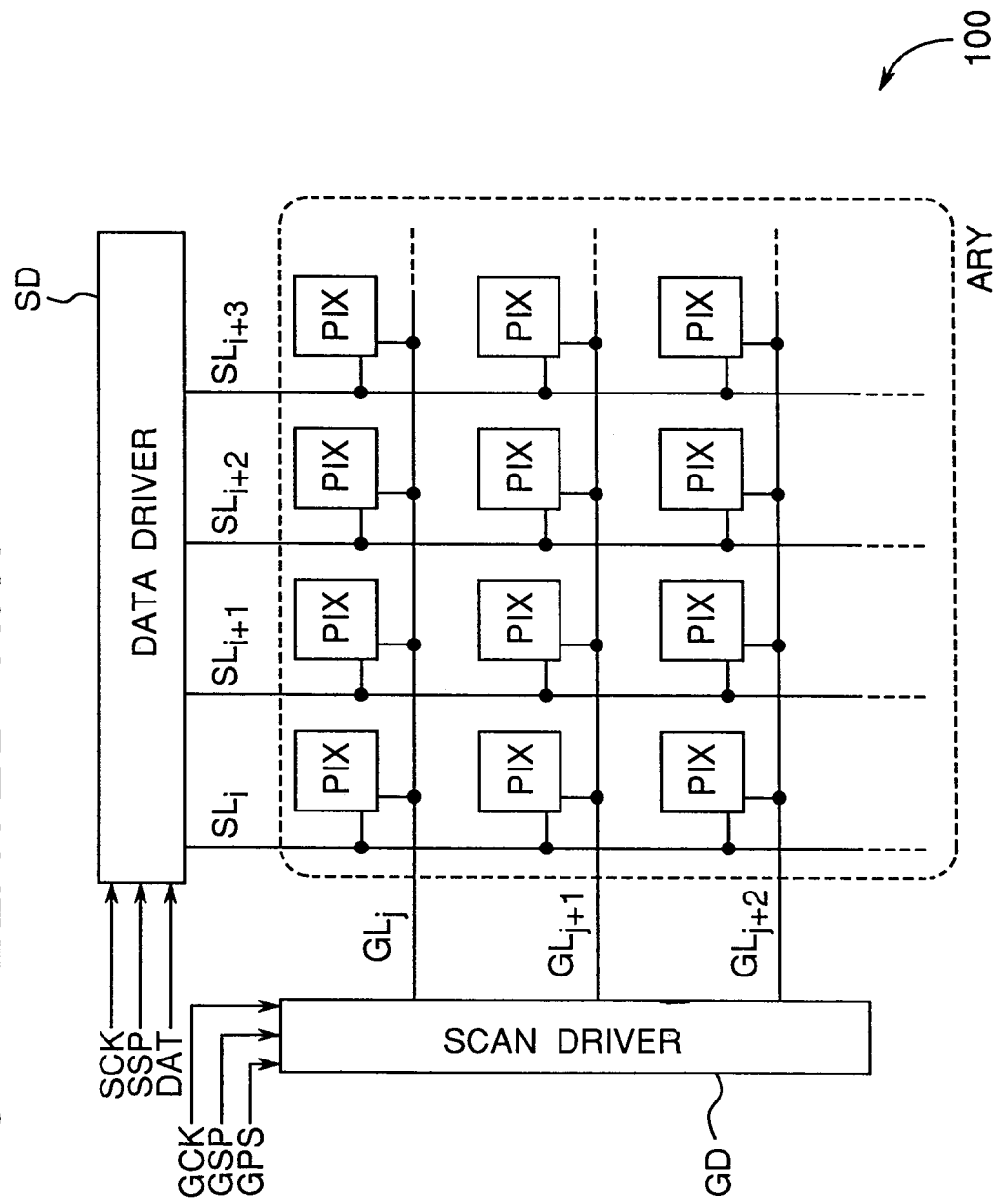
FIG. 19 shows a conventional active matrix-driven LCD device.
Figure 20:
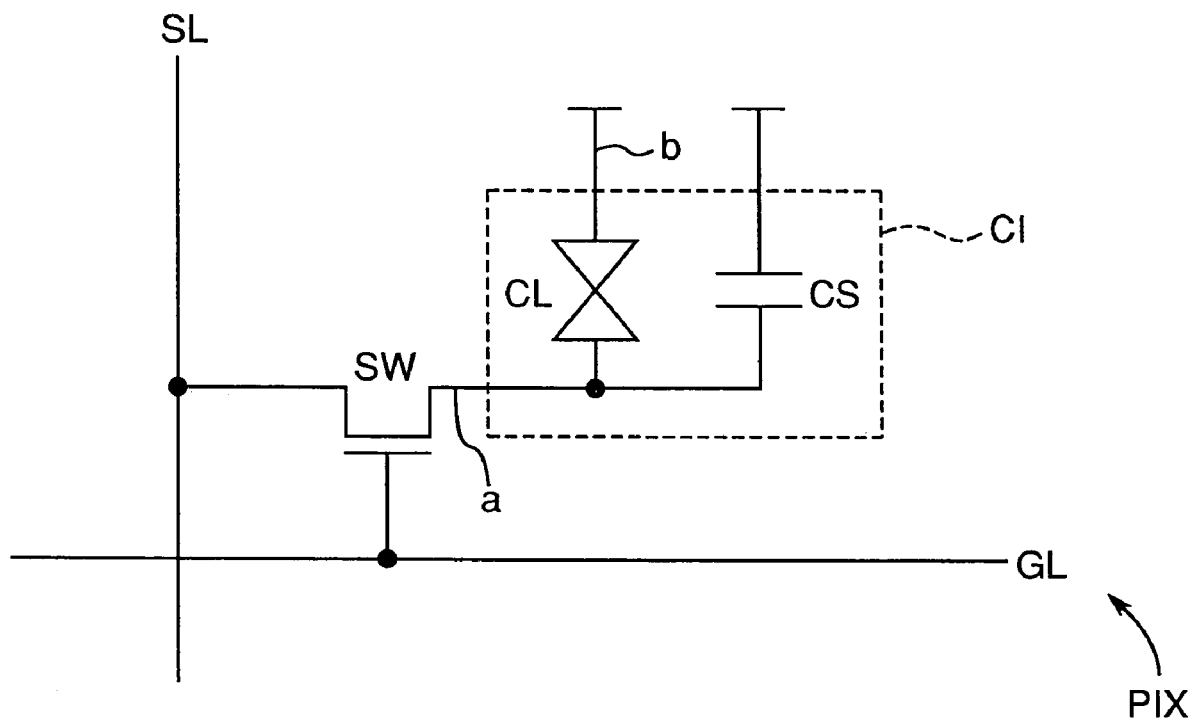
FIG. 20 details a pixel PIX shown in FIG. 19.

The driving method of the embodiment is directed to an active matrix LCD device having the conventional circuitry shown in FIG. 19. Each of the scan driver and the data driver of this LCD device may have either a shift register circuit designed such that a clock signal is supplied to a latch circuit in which a pulse signal to be transferred is present and its neighboring latch circuits only (e.g., the circuit shown in FIG. 1) or a shift register circuit designed such that a clock signal is supplied to all the latch circuits (e.g., the circuit shown in FIG. 24).

First, for a first black display period in which black display is performed in the upper black display area on the upper side of the screen, the scan driver clock signal for activating the shift register circuit within the scan driver is set to a frequency of 39.4 kHz, 2.5 times as high as the frequency of 15.7 kHz of a video display period in which video, or pictures are displayed in the video display area of the screen. Further, a scan driver start signal to be supplied to the shift register circuit of the scan driver is supplied in synchronization with the leading edge of the vertical synchronous signal as shown in the figure. Although FIGS.

30A–30E take an example in which the shift register circuit is activated in synchronization with leading edges of clock pulses, yet for use of a shift register circuit which is activated in synchronization with trailing edges of the clock pulses, a start signal pulsing at timing appropriate for such a shift register circuit should be used.

Also, although the scan driver clock signal during the first black display period is set to a frequency 2.5 times as high as that of the video display period with a view to enhancing the scan rate in this embodiment, yet the multiplier, or multiplication factor involved does not necessarily need to be 2.5 (×2.5). However, since this multiplication factor and the area of the black display area are inversely proportional to each other, there is a need of selecting a multiplication factor that is well balanced in terms of display.

In many active matrix type LCDs, because alternating voltage is applied to liquid crystals, it is often the case that the applied voltage is alternated in polarity between positive and negative every vertical scan line. In this case, there is a need of alternating the polarity of the applied voltage every vertical scan line also in doing the black display. Taking this also into consideration, the multiplication factor for the scan driver clock signal needs to be determined so that black display can be done to all the horizontal lines in the upper black display area, and that the polarity of the applied voltage can be alternated every vertical scan line.

The multiplication factor in this embodiment is set to 2.5 as described above, where the cycle period per vertical scan is 26.4 µs. If the cycle period is quite shorter than this, the time duration for which the voltage is applied to liquid crystals would be also shortened, which gives rise to a fear of insufficient write. Therefore, taking into consideration factors such as the balance of the black display area as described above, the multiplication factor for the scan driver clock signal is desirably about 1.5 to 10.

Also in the first black display period in which black display is made in the screen upper part, the data driver clock signal for operating a shift register circuit within the data driver has a frequency equivalent to the frequency for the video display period. Further, the data driver start signal holds "H" level during the first black display period.

In the data driver, a sampling pulse for sampling of video data is created based on the data driver start signal supplied to the shift register circuit. The sampling section, to which the sampling pulse is supplied, detects leading edges of the sampling pulses to do the sampling.

In this case, during the first black display period, the data driver start signal is held at "H" level. By so doing, all analog switches of the sampling section are always ON state. As a result, a video signal always having the black level potential is output to all the data signal lines, resulting in that all the horizontal lines assume the same black level voltage even if the number of horizontal lines in the upper black display area becomes large. Therefore, nonuniformities in black display among the horizontal lines during the first black display period are eliminated, and a stable black display is performed. Besides, the voltage level of the internal nodes included in a plurality of latch circuits within the shift register circuit is stabilized.

In this embodiment, the sampling section detects leading edges of the sampling pulses to perform sampling, as described above. However, in the case where the sampling section is activated at trailing edges of sampling pulses, the polarity of the data driver start signal to be supplied to the shift register circuit should be altered accordingly, though no large change is needed for the timing itself of the data driver start signal.

Next, a first stabilization period after an end of the first black display period is described. In this first stabilization period, the scan driver clock signal to be supplied to the shift register circuit of the scan driver has d.c. components (level "L") only. That is, during this first stabilization period, the shift register circuit within the scan driver does not operate, and no image data are written to the pixels of the liquid crystal panel. Further, during this period, the frequency of the data driver clock signal supplied to the shift register circuit within the data driver is ¼ the frequency of the data driver clock signal supplied during the video display period and the first black display period.

This first stabilization period has a length corresponding to four horizontal scan periods, and in this period a process of stabilizing the voltage level of all the internal nodes of the shift register circuit of the data driver is performed. In this embodiment, the frequency of the data driver clock signal during the first stabilization period is set to ¼ times as high as that of the first black display period and the video display period, and the length of the first stabilization period is set to four horizontal scan periods, as already described. However, these values are nothing but an example. Nonetheless, the multiplication factor for frequency, if extremely large, would make it impossible to stabilize the internal nodes. Extremely small multiplication factors, conversely, would make it impossible to perform the stabilization process for all the internal nodes within one vertical scan period. Thus, the multiplication factor for frequency is desirably set to about ½ to ¹⁄₃₂. Also, the first stabilization period length is desirably set to two to 32 horizontal scan periods or so according to the multiplication factor for frequency.

Further, the data driver start signal supplied to the shift register circuit of the data driver during the first stabilization period is a one-pulse signal such that, as shown in FIGS. 30D and 30E, after a sampling pulse has been supplied to the first-stage latch circuit of the shift register circuit based on the data driver clock signal lowered in frequency, no other sampling pulses are inhibited from being supplied thereto until the next video display period.

Next, a video display period subsequent to the first stabilization period is described. Video display processing performed during this video display period is basically similar to the conventional video display processing performed by the conventional LCD driving method. However, it is assumed in this embodiment that in an LCD having a screen aspect ratio of roughly 4:3, a video signal complying with the NTSC system is displayed at an aspect ratio of roughly 16:9 for the video display area, with black display areas provided in upper and lower parts of the screen. Therefore, if an LCD having 230 scan signal lines is used, the number of scan signal lines in the video display area is generally around 170 because of the presence of the black display areas in upper and lower parts of the screen. However, since the video signal complies with the NTSC system, there arises a need of taking measures such as decimating the generally 230 effective horizontal scan lines and displaying a video image by using the remaining horizontal scan lines, or once writing the video signal complying with the NTSC system based on a write clock to a video field memory or the like and then reconstructing the video signal with a read clock of a frequency lower than the write clock. These techniques are well known and description about these is omitted here.

Figure 30:
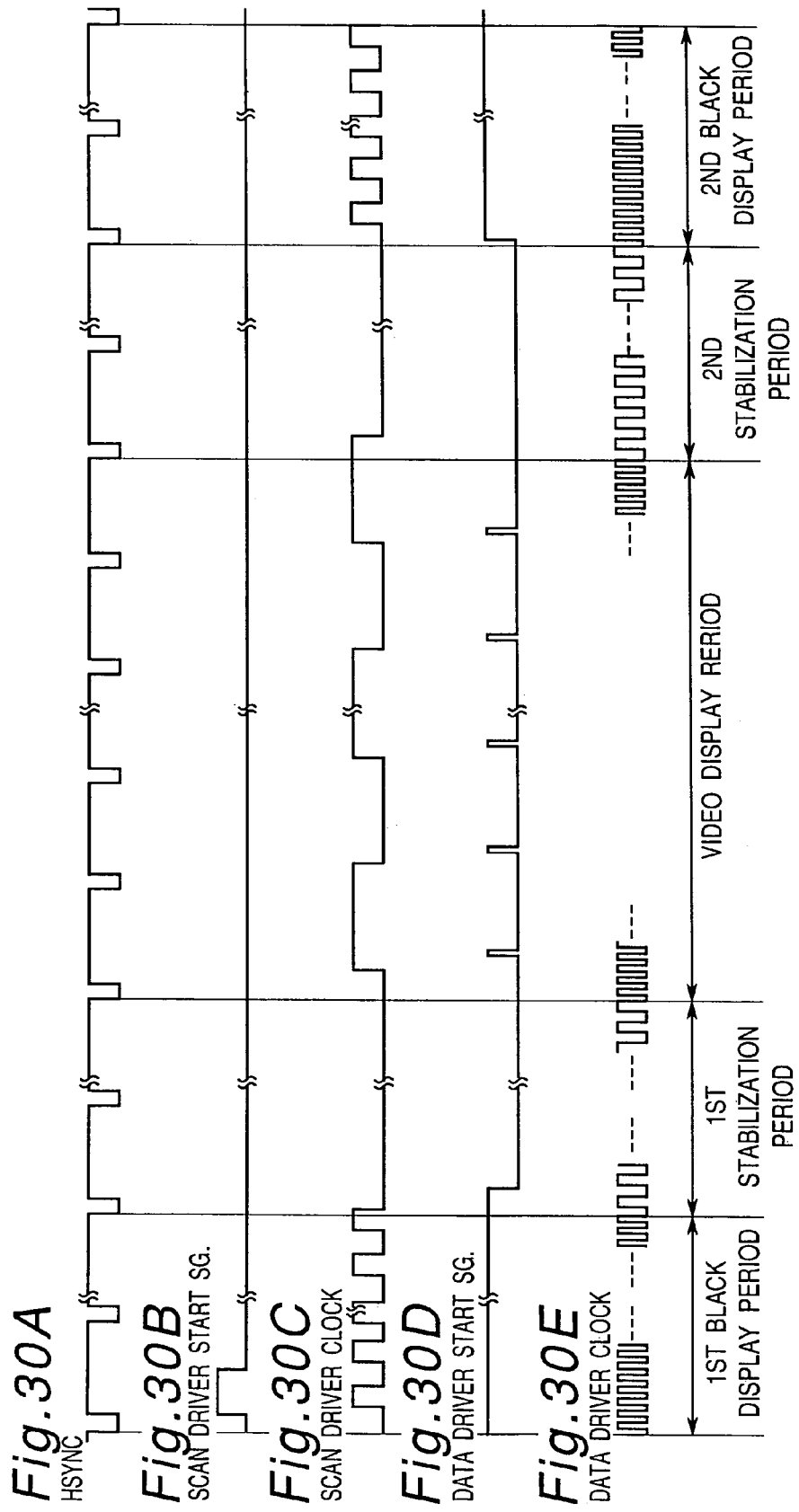
FIGS. 30A, 30B, 30C, 30D and 30E are timing charts of one vertical scan period of individual signals for realizing the drive method for LCDs according of the invention.

Next, a second stabilization period subsequent to the video display period is described. Basically, the scan driver clock signal and the scan driver start signal to be supplied to the shift register circuit of the scan driver as well as the data driver clock signal and the data driver start signal to be supplied to the shift register circuit of the data driver are the same as those of the above-described first stabilization period. However, if there is no problem in terms of display, the data driver start signal to be supplied may be a signal having a polarity reverse to that in the first stabilization period (FIG. 30 shows a case of reverse polarity). Also, the frequency of the data driver clock signal does not need to be the same as the frequency of the first stabilization period, and may be changed to any arbitrary frequency different from that of the first stabilization period.

Next, a second black display period in which black display is performed in the lower black display area on the lower side of the screen subsequent to the second stabilization period is described. The scan driver clock signal and the scan driver start signal as well as the data driver clock signal and the data driver start signal for this second black display period may be the same as those of the first black display period. Further, the frequency of the scan driver clock signal may differ from the frequency of the first black display period unless the upper and lower black display areas go off-balance in breadth.

As described above, in this embodiment, a first stabilization period is provided between a first black display period for performing black display in the upper black display area in upper part of the screen, and a video display period for displaying pictures in the video display area adjoining the upper black display area. Further, a second stabilization period is provided between the video display period and a second black display period for performing black display in the lower black display area adjoining the video display area. Then, during these stabilization periods, the operation of the shift register circuit of the scan driver is halted, while the frequency of the data driver clock signal is lowered to, for example, ¼ the frequency used in the first, second black display periods and the video display period. Thus, the voltage level of all the internal nodes of the shift register circuit of the data driver is stabilized.

In the first black display period and the second black display period, the frequency of the scan driver clock signal is set to, for example, 2.5 times as high as the frequency of the video display period with a view to obtaining a higher scan rate, so that black display is securely implemented in the upper and lower black display areas. Further, the frequency of the data driver clock signal for these black display periods is set equivalent to the frequency for the video display period, while the data driver start signal is held at "H" level (or "L" level) By so doing, analog switches provided within the data driver for sampling the video signal are normally held at ON state, so that nonuniformities in black display during the first and second black display periods can be eliminated, and that a stable black display can be performed. Besides, the voltage level of the internal nodes included in a plurality of latch circuits within the shift register circuit is stabilized.

Consequently, according to this embodiment, in performing black display in upper and lower parts of the display screen, a high-grade, stable black display free from black-display nonuniformities is achieved. Also, the voltage level of the internal nodes within the data driver is stabilized, and as a result, malfunctions of the data driver can be prevented.

One example of the LCD driving method of the invention has been described as being directed to an LCD which requires the stabilization of internal nodes in the shift register circuit of the data driver, but the same driving method may be introduced into LCDs which do not require such processing, without any changes. Thus, LCD drivers employing the driving method of the embodiment can be used in LCD devices of any type. If such LCD drivers are prepared beforehand, they have only to be connected to desired LCD devices.

Figure 31:
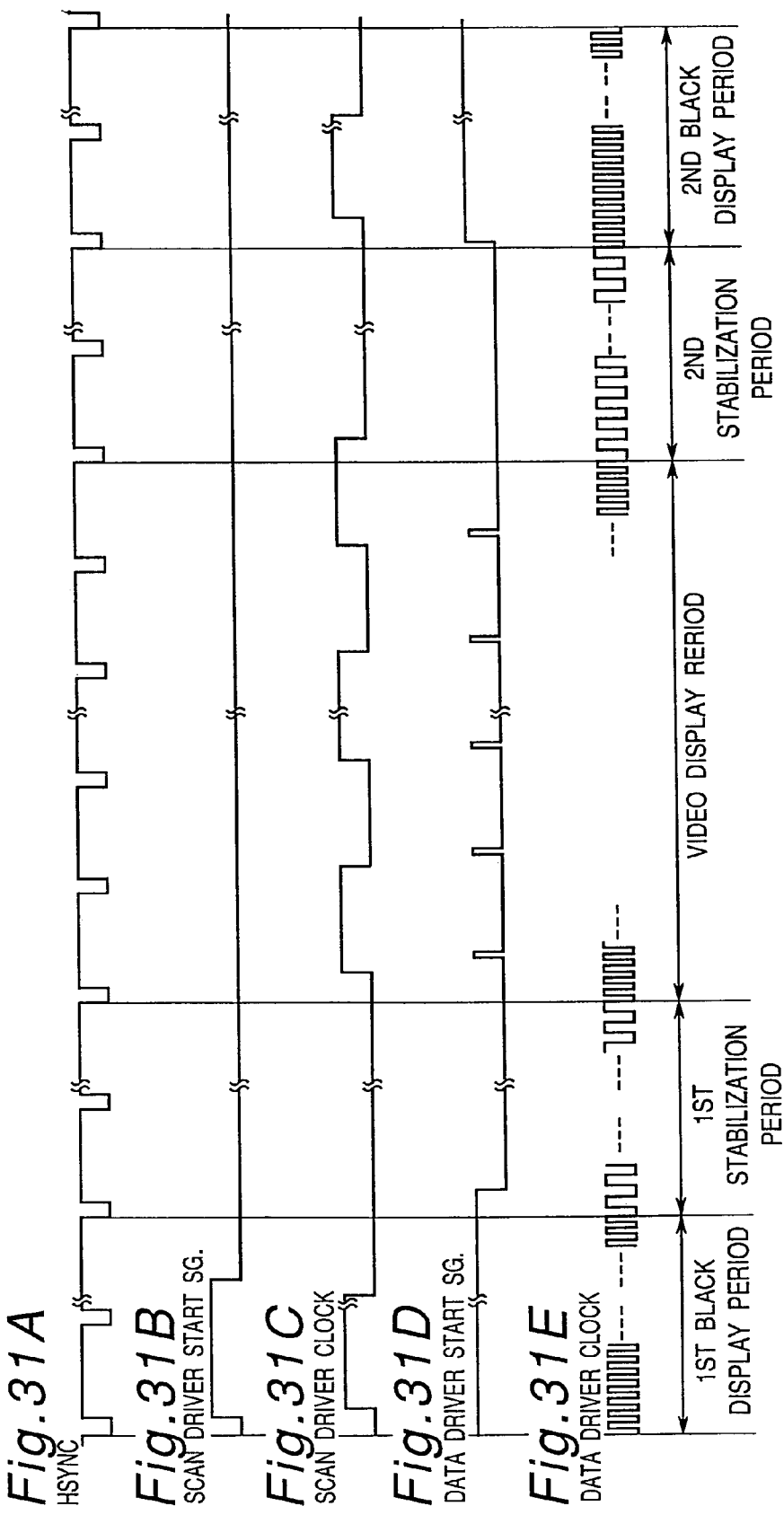
FIGS. 31A, 31B, 31C, 31D and 31E are timing charts different from FIGS. 30A–30E.
Figure 32:
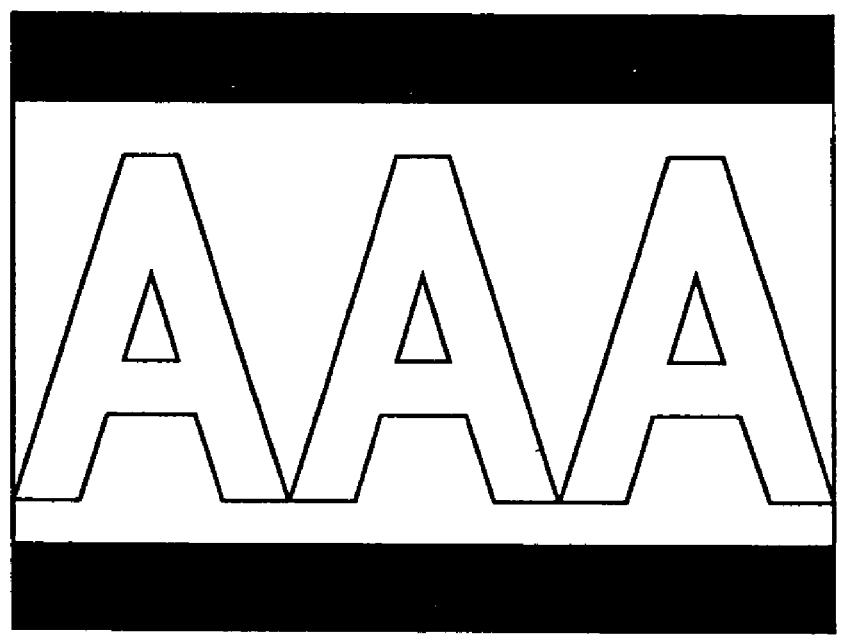
FIG. 32 shows an example of the screen in which black display is given in upper and lower parts.
Figure 33A:
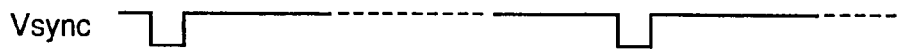
FIGS. 33A, 33B and 33C are timing charts of individual signals in the case where black display is performed in upper and lower parts of the screen by a conventional liquid crystal panel drive circuit.
Figure 33B:
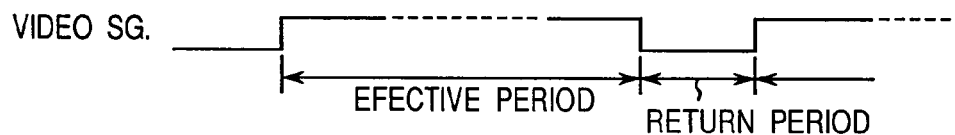
Figure 33C:
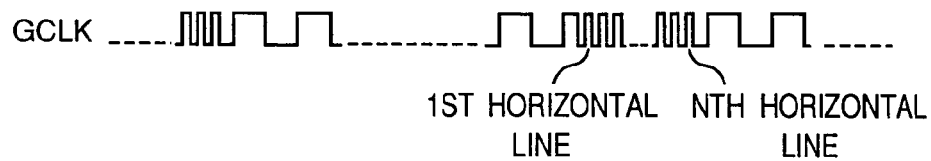
Figure 34:
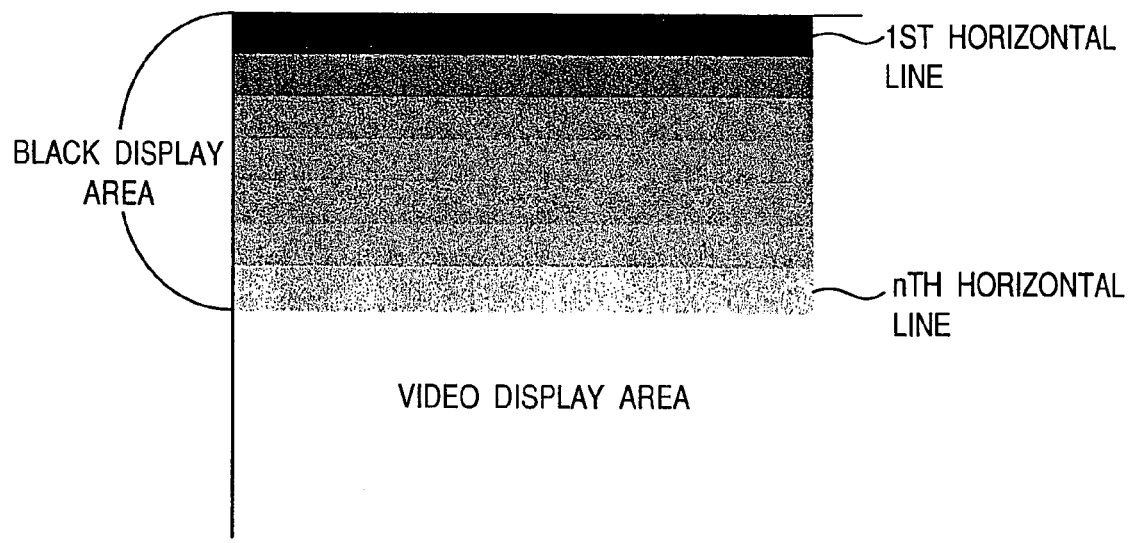
FIG. 34 is an explanatory view of gradation that would appear in a wide black display area when the conventional liquid crystal panel drive circuit is used.

As shown above, this embodiment has been described on a case where in an LCD having a screen aspect ratio of about 4:3, a video signal complying with the NTSC system is displayed at an aspect ratio of about 16:9 for the video display area with black display areas provided in upper and lower parts. However, in the case where the two aspect ratios are other than the above values and moreover the black display areas provided in upper and lower parts of the screen are relatively small, the frequency of the scan driver clock signal does not need to be as high as the frequency shown in FIG. 30C during the first and second black display periods, as is obvious from FIG. 31C. where similar effects can be obtained even if the shift register circuit of the scan driver is driven by the clock signal of a frequency same as that for the video display period.

In the above embodiment a video signal of the NTSC system is used, although the invention may be applied also to other video signals such as the PAL system, the SECAM system, and besides, VGA (video graphics array) and XGA (extended graphics array) systems that are video formats for personal computers.

To mention additionally, in various video signal formats such as the NTSC system, it is often the case that the signal level in an area corresponding to a vertical return period is generally at black level. Therefore, the above embodiment has been described by taking an example in which the vertical return period is utilized as it is. However, if a more assurable black level period is required, black level periods may be inserted positively into the vertical return periods.

Further, LCDs, to which the driving method in this embodiment is applicable, are not particularly limited. The invention may be applied to any active matrix LCD in which pixel electrodes are connected to data signal lines by switching devices based on a control signal output from the scan driver and a video signal output from the data driver is supplied to the pixel electrodes via the data signal lines, and pictures based on the video signal are displayed at the pixel matrix.

In such a case, at least one of the scan driver and the data driver may share the substrate with the pixel electrodes, so that the LCD can be downsized and reduced in cost (see FIG. 16B and FIG. 21). Also, the polysilicon thin-film transistors as the switching devices may be formed on a glass substrate at temperatures below 600° C., so that high-definition display and lower cost can be achieved. Such polysilicon thin films can be formed by using the process described before with reference to FIGS. 18A–18K.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A shift register circuit, comprising:
    a plurality of latch circuits connected in series to sequentially transfer externally generated information pulse signals from one to another;
    a clock signal line transmitting a clock signal; and
    a plurality of switching circuits performing electrical connection and disconnection between the clock signal line and the plurality of latch circuits according to either input externally generated pulse signals or internal pulse signals that are externally generated pulses being transferred between the latch circuits, wherein the shift register circuit has alternate initialization periods and normal operation periods, and during the normal periods the latch circuits sequentially transfer said information pulse signals;

the initialization periods are started either by an externally generated power on pulse signal input to the shift register circuit at power on or by externally generated cyclic signals separate from said information pulse signals input to the shift register circuit at regular intervals following the power on pulse signal;

a first externally generated clock signal input to the shift register circuit during said initialization periods has a frequency different from a frequency of a second externally generated clock signal input to the shift register circuit during said normal operation periods; and during each of said initialization periods, at least one of the switching circuits electrically disconnects at least one of the plurality of latch circuits from the clock signal line in response to either a first externally generated clock signal or an internal signal that is a first externally generated clock signal being transmitted along the clock signal line.

2. The shift register circuit according to claim 1, wherein:

potentials at nodes of the plurality of latch circuits vary in accordance with the pulse signal transferred;

the plurality of switching circuits each connect or disconnect corresponding latch circuits to or from the clock signal line in accordance with the potentials at the nodes of the corresponding latch circuits; and in at least part of a period in which the pulse signal is transferred from a first latch circuit through a last latch circuit, the clock signal has a frequency lower than in a normal operation period.

3. The shift register circuit according to claim 2, wherein the frequency of the clock signal in said at least part of the period is from ½ to 1/16 of a frequency of the clock signal in the normal operation period.

4. The shift register circuit according to claim 1, wherein the clock signal has an amplitude smaller than an amplitude of a power-supply voltage of the shift register circuit.

5. The shift register circuit according to claim 1, further comprising a buffer circuit supplying the plurality of latch circuits with a clock signal received from outside.

6. The shift register circuit according to claim 1, wherein a clock signal received from outside has an amplitude different from an amplitude of the clock signal supplied to the plurality of latch circuits, and the shift register circuit further comprises a level shifter changing the amplitude of the clock signal received from outside.

7. An active matrix image display device, comprising:

a plurality of pixels arranged in a matrix form;

a data signal line supplying video data to be written to one of the plurality of pixels;

a scan signal line for controlling the writing of the video data to one of the plurality of pixels;

a data driver supplying the video signal to the data signal line in synchronization with a timing signal; and a scan driver supplying a pulse signal to the scan signal line in synchronization with a timing signal, at least one of the data driver and the scan driver comprising the shift register circuit according to claim 1.

8. The image display device according to claim 7, wherein the data driver has the shift register circuit, and initializes the potential level at each of internal nodes of the plurality of latch circuits in the shift register circuit in synchronization with a vertical synchronous signal.

9. The image display device according to claim 7, wherein at least one of the data driver and the scan driver is formed on a substrate on which the plurality of pixels are also formed.

10. The image display device according to claim 9, wherein active devices included in at least the data driver comprise polysilicon thin-film transistors.

11. The image display device according to claim 10, wherein the active devices have been formed on a glass substrate by a process at a temperature of 600° C. or lower.

* * * * *